(12) United States Patent
Fujishima et al.

(10) Patent No.: US 6,459,101 B1
(45) Date of Patent: Oct. 1, 2002

(54) SEMICONDUCTOR DEVICE

(75) Inventors: Naoto Fujishima; Akio Kitamura, both of Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/671,989

(22) Filed: Sep. 28, 2000

(30) Foreign Application Priority Data

Sep. 28, 1999 (JP) ............................................ 11-274482

(51) Int. Cl.[7] ........................ H01L 29/74; H01L 31/111
(52) U.S. Cl. ........................ 257/133; 257/339; 257/342; 257/653
(58) Field of Search ................................ 257/133, 335, 257/339, 342, 653, 355

(56) References Cited

U.S. PATENT DOCUMENTS

| | | | | |
|---|---|---|---|---|
| 4,819,045 A | * | 4/1989 | Murakami | 357/23.4 |
| 5,432,370 A | * | 7/1995 | Kitamura et al. | 257/339 |
| 5,523,599 A | * | 6/1996 | Fujishima et al. | 257/335 |
| 5,534,721 A | * | 7/1996 | Shibib | 257/339 |
| 5,742,087 A | * | 4/1998 | Lidow et al. | 257/342 |
| 5,747,853 A | * | 5/1998 | So et al. | 257/355 |
| 5,804,864 A | * | 9/1998 | Akiyama | 257/408 |
| 5,889,310 A | * | 3/1999 | Terashima et al. | 257/409 |
| 6,207,994 B1 | * | 3/2001 | Rumennik et al. | 257/342 |
| 6,236,068 B1 | * | 5/2001 | Feiler | 257/133 |

* cited by examiner

Primary Examiner—David Nelms
Assistant Examiner—Andy Huynh
(74) Attorney, Agent, or Firm—Rossi & Associates

(57) ABSTRACT

A semiconductor device is provided which relieves the concentration of electric fields generated at a corner part and the like even, if the integration degree of the device is improved, and thus easily improves a current driving performance by improving the integration degree. In the semiconductor device, an N well is formed on a p type substrate, and a drain is formed inside the N well. A P base is formed outside the N well, and the P base and the drain have straight portions with a uniform interval. A corner part is formed at an end portion of the straight portions. At the corner part of the drain, the interval between the P base and the drain is larger than the interval between the straight portions, and the conductivity characteristics in the larger interval region are different from those of the N well along a predetermined width WI in order to relieve the concentration of electric fields at the corner part.

29 Claims, 20 Drawing Sheets

SEMICONDUCTOR DEVICE

FIELD OF THE INVENTION

The present invention relates generally to a high voltage semiconductor device, and more particularly to a high voltage lateral power semiconductor device for a switching power supply, a motor drive, a fluorescent inverter drive and the like.

BACKGROUND OF THE INVENTION

PWM control method has become widespread for a switching power supply, a motor drive and a fluorescent inverter drive. With respect to a control circuit, there is the need for improving the function, reducing the size and cost, improving the reliability and reducing the electricity consumption. Accordingly, there is an increasing demand for a power IC in which high voltage power elements are integrated. A power IC for a power supply, which drives commercial 100–200V, requires an element breakdown voltage of 700V in order to drive a transformer. To facilitate the integration with a control part, the power IC must be lateral and its substrate and drift region has a high resistivity (a low impurity concentration) (Journal of Electricity EDD-93-21, P21-29, Toshihiko Uno et al. "Reduction in ON resistance of a high voltage lateral power MOSFET for IPD"). With respect to the layout of the device, opposite electrodes must be arranged in the teeth of comb pattern in order to improve a current driving performance per unit area. To improve the integration degree, however, the radius of curvature is small at a corner part of the teeth of comb pattern. This induces the local concentration of electric fields, and lowers the breakdown voltage by about 20%.

FIG. 18 is a plan view of a conventional high voltage lateral power semiconductor device as a first example, and FIG. 19 is a cross-sectional view taken along line A-B of FIG. 18. As shown in FIG. 19, this semiconductor device is constructed in such a manner that an N well 2 and a P base 3 are formed on a p type substrate with a high resistivity of about 150 Ωcm. The N well 2 has a surface impurity concentration of $1 \times 10^{16}/cm^3$, and a diffusion depth of 6 μm. The amount of donor in the N well 2 is $1 \times 10^{12}/cm^2$. The total amount of donor in the N well, the resistivity of the P substrate and the distance of the drift region are optimized to achieve a high breakdown voltage.

The P base, which forms a source region, has a surface concentration of $3 \times 10^{16}/cm^3$, and a diffusion depth of 6 μm. A threshold voltage of a power MOS is determined according to the surface concentration. Then, a thermal oxide film 4 with a thickness of 0.6 μm, and a polysilicon gate 6 is formed through a gate oxide film 5 of 25 μm. An $n^+$ diffused layer with a surface concentration of $1 \times 10^{20}/cm^3$, and a diffusion depth of 0.2 μm is formed in a source 7 and a drain 8, and a contact $P^+$ diffused layer (with a surface concentration of $5 \times 10^{19}/cm^3$, and a diffusion depth of 0.5 μm) 9 is formed on the surface of the P base. An interlayer insulating film 10 is formed and a contact hole 11 is opened, and then a source electrode 12 and a drain (gate) electrode 13 are formed.

In this prior art, the device is shaped like the teeth of comb having a straight portion 20 in which the P base region 3 forming the source region and the drain 8 are parallel to one another if they are viewed prospectively, and corner parts 21, 22 having the same interval between the P base region 2 and the drain 8 as the parallel interval of the straight portion 20. If there is the need for an actual output current capacity of 2–5 A class, a channel width must be not less than 50 mm and the number of teeth of comb must be more than 10 and less than 20.

In this prior art, the straight portion 20 and an end portion of the teeth of comb pattern at the corner part have the cross-sectional structure shown in FIG. 19. If the radius of curvature is 100 μm, the breakdown voltage is 800V. If, however, radius of curvature is 12.5 μm, the electric fields are heavily concentrated at the corner part. This lowers the breakdown voltage to 600V. Therefore, the radius of curvature must be not less than 50 μm in order to ensure the breakdown voltage of 700V. More specifically, a device pitch cannot be reduced, and it is therefore impossible to improve the current driving performance per unit area. Accordingly, the breakdown voltage of the power semiconductor device is 700V and the ON resistance per unit area is about 90 Ω/mm² in this prior art.

FIG. 20 is a cross-sectional view of a conventional high voltage lateral power semiconductor device as a second example. A plan view thereof is the same as FIG. 18.

In the second example, an N well 2A is formed on a p type substrate 1 with a high resistivity of about 150 Ωcm, and a P base 3A is formed inside the N well 2A. The N well 2A has a surface impurity concentration of $1 \times 10^{16}/cm^3$, and a diffusion depth of 6 μm. The amount of donor in the N well 2A is $1 \times 10^{12}/cm^2$. The total amount of donor in the N well 2A, the resistivity of the P substrate 1 and the distance of the drift region are optimized to achieve a high breakdown voltage. The P base 3A has a surface concentration of $3 \times 10^{16}/cm^3$, and a diffusion depth of 2 μm. A threshold voltage of a power MOS is determined according to the surface concentration. A p type surface region 14 is formed between the P base 3A and an $n^+$ drain. The p type surface region 14 has a surface impurity concentration of $5 \times 10^{16}/cm^3$, and a diffusion depth of 1 μm.

In the prior art of the second example, a straight portion and a corner part 22A (see FIG. 18) at an end portion of the teeth of comb have the cross-sectional structure shown in FIG. 20. If the radius of curvature is 100 μm, the breakdown voltage is 800V. If, however, radius of curvature is 12.5 μm, the electric fields are heavily concentrated at the corner part. This lowers the breakdown voltage to 600V. For this reason, the radius of curvature cannot be reduced to not less than 50 μm in order to ensure the breakdown voltage of 700V. More specifically, the device pitch cannot be reduced, and it is therefore impossible to improve the current driving performance per unit area. Accordingly, the ON resistance per unit area is as high as 60 Ω/mm² if the radius of curvature is set at 50 μm in order to ensure the breakdown voltage of 700V.

To address this problem, a semiconductor device of the third example is known in which a drain corner part has an electric field relieving structure as disclosed in Japanese Patent Provisional Publication No. 6-244412.

FIG. 21 is a plan view showing a prior art of the third example, and FIGS. 22(a)–22(c) are partial cross-sectional views showing principal parts of FIG. 21. FIG. 22(a) is a cross-sectional view taken along line A-B of FIG. 21, FIG. 22(b) is a cross-sectional view taken along line C-D of FIG. 21, and FIG. 22(c) is a cross-sectional view taken along line E-F of FIG. 21. In this structure, the end portion 22A at the drain corner part in FIG. 18 is shortened as shown in FIG. 21, and the p type surface region 14 in this region is eliminated by a length L and a width W to form an n type surface region 16. The width W of the eliminated region is optimized to thereby relieve the electric fields at the corner part.

In this structure, however, the relief of the electric fields must be adjusted within the width of the p type surface region 14 in the N well 2A of at the drain corner end portion. Since the N well 2A has a relatively high surface impurity concentration, the range of optimum values of the width W is very narrow and this increases the dispersion in the breakdown voltage. For this reason, the radius of curvature needs to be 30 μm in order to ensure the breakdown voltage of 700V, and thus, the ON resistance per unit area is lowered by only 15%. It is therefore impossible to satisfactorily lower the ON resistance.

As stated above, the conventional semiconductor devices have disadvantages because the electric fields are concentrated at the corner part and the breakdown voltage cannot be sustained if the integration degree is improved for the purpose of improving the current driving performance. It is therefore difficult to improve the current driving performance by improving the integration degree.

It is therefore an object of the present invention to provide a semiconductor device, which is able to relieve the concentration of the electric fields generated at the corner part and the like even if the integration degree of the device is improved, and therefore easily improves the current driving performance by improving the integration degree.

SUMMARY OF THE INVENTION

To accomplish the above object, a semiconductor device is provided which broadens the interval in a voltage applied region at a corner part, provides a region with an optimized impurity concentration in that part, and fills a depletion layer to thereby relieve the concentration of electric fields.

More specifically, the present invention is directed to a semiconductor device, in which a second-conductivity-type well is formed on a first-conductivity-type semiconductor substrate and a second-conductivity-type diffused region is formed inside the well, and in which a first-conductivity-type diffused region is formed at a desired position on the first-conductivity-type semiconductor substrate, the first-conductivity-type diffused region and the second-conductivity-type diffused region having straight portions with an uniform interval, a corner part being formed at an end portion of the straight portions, the semiconductor device characterized in that: at the corner part in the second-conductivity-type diffused region, the interval between the first-conductivity-type diffused region and the second-conductivity-type diffused region is larger than the interval between the straight portions, and the conductivity characteristics in a larger interval region are different from those of the second-conductivity-type well along a predetermined width in order to relieve concentration of electric fields at the corner part. This arrangement relieves the concentration of electric fields at the corner part and the like, and therefore easily improves the current driving performance by improving the integration degree.

According to the present invention, a first-conductivity-type region is formed along a predetermined width in the interval region. With this arrangement, a depletion layer is spread into the first-conductivity-type region provided in the interval region. For example, the first-conductivity-type semiconductor substrate can be used as the first-conductivity-type region in the interval region, and this extremely simplifies the structure by eliminating the necessity of adding any impurities. In this case, the high-resistivity first-conductivity-type semiconductor substrate is sued as the first-conductivity-region in the depletion layer, and this enables the uniform relief of the electric fields to obtain an optimum value of the interval region in a relatively wide range. This makes it possible to easily adjust the relief of the electric fields.

According to the present invention, a second-conductivity-type region is formed along a predetermined width in the interval region, the second-conductivity-type region having a different impurity concentration from that of the second-conductivity-type well. With this arrangement, the depletion layer can be spread by adjusting the impurity concentration of the second-conductivity-region, and this enables the uniform relief of the electric fields and achieves the high breakdown voltage.

If, for example, the n type second-conductivity-region is formed of phosphorous P, the phosphorous is deposited on an interface of an oxide film and a silicon substrate by thermal treatment, and therefore, the surface of the substrate has a high concentration. Thus, the surface can be composed of high-concentration n type impurities, and this controls the shift in the breakdown voltage caused by plus electric charge generated inside the oxide film and on the surface of the device.

According to the present invention, a second-conductivity-type region and a first-conductivity-type surface layer formed thereon are formed along a predetermined width in the interval region, the second-conductivity-type region having a different impurity concentration from the second-conductivity-type well along a predetermined width. This arrangement achieves the high impurity concentration of each conductivity-type region, and controls the shift in the breakdown voltage caused by the plus electric charge.

According to the present invention, a plurality of first-conductivity-type regions and second-conductivity-type regions is formed along a predetermined width in the interval region. This arrangement achieves the high impurity concentration of each conductivity-type region, and controls the shift in the breakdown voltage caused by the plus electric charge.

According to the present invention, a first-conductivity-type diffused surface layer is formed on a surface of the second-conductivity-type well. With this arrangement in which the first-conductivity-type diffused surface layer is formed on the surface of the second-conductivity-type well, the amount of impurities is increased in the second-conductivity-type well. This reduces a drift resistance if the device has a high breakdown voltage.

According to the present invention, a second-conductivity-type region and a first-conductivity-type surface layer formed thereon are formed along a predetermined width in the interval region, the second-conductivity-type region having a different impurity concentration from the second-conductivity-type well along a predetermined width. With this arrangement in which the first-conductivity-type diffused surface layer is formed on the surface of the second-conductivity-type well, the impurity concentration of the second-conductivity-type well can be increased to thereby reduce the drift resistance of the second-conductivity-type well if the device has a high breakdown voltage. Moreover, the impurity concentration of the second-conductivity-type region and the first-conductivity-type surface layer can be increased to thereby to control the shift in the breakdown voltage caused by the plus electric charge.

According to the present invention, the first-conductivity-type diffused region and the second-conductivity-type diffused region are opposite to one another and form the teeth of comb pattern, and the corner part is formed at an end portion of the teeth of the comb pattern. This arrangement broadens a channel width, and increases the current driving performance.

According to the present invention, the first-conductivity-type diffused region is formed inside the second-conductivity-type well. With this arrangement in which the first-conductivity-type region is formed inside the second-conductivity-type well, the impurity concentration of the drain region adjacent to a channel can be increased when a MOSFET is formed. This reduces a drain resistance.

According to the present invention, the first-conductivity-type diffused region is formed outside the second-conductivity-type well. This arrangement increases a channel length to thereby control the operation of parasitic bipolar transistors provided between the N well, the P base and the source.

According to the present invention, a second-conductivity-type source region is formed inside the first-conductivity-type region, and the second-conductivity-type diffused region formed inside the second-conductivity-type well is a MOSFET that functions as a drain region. This arrangement makes it possible to relieve the concentration of electric fields generated at the corner part and the like even if the integration degree of the device is improved. This realizes a high voltage MOSFET device that is capable of easily improving the current driving performance by improving the integration degree.

DETAILED DESCRIPTION OF THE PREFERRED EMBODIMENTS OF THE INVENTION

A detailed description will hereunder be given of preferred embodiments of the present invention with reference to the accompanying drawings.

Embodiment 1

According to the first embodiment, an N well as a second-conductivity-type well is formed on a p type substrate as a first-conductivity-type semiconductor substrate. A first-conductivity-type diffused region is formed as a p base outside the well, and a second-conductivity-type diffused region is formed as a drain inside the well. The first-conductivity-type diffused region and the second-conductivity-type diffused region are shaped like the teeth of a comb. The interval between the first-conductivity-type diffused region and the second-conductivity-type diffused region in a part where the second-conductivity-type forms an end portion of the teeth of the comb is larger than the interval in other straight portions. The second-conductivity-type well at the end portion is partially formed as a first-conductivity-type region.

Figure 1:
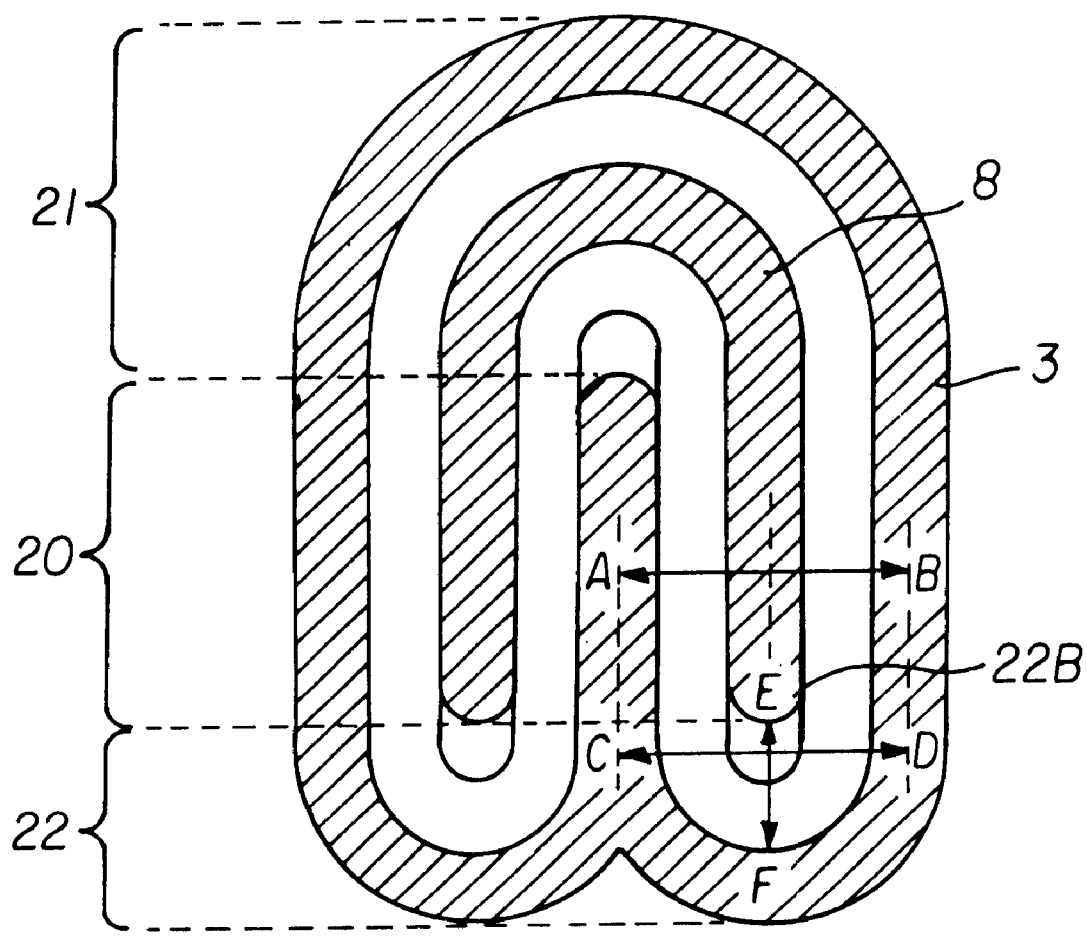
FIG. 1 is a plan view showing a first embodiment of the present invention.
Figure 2A:
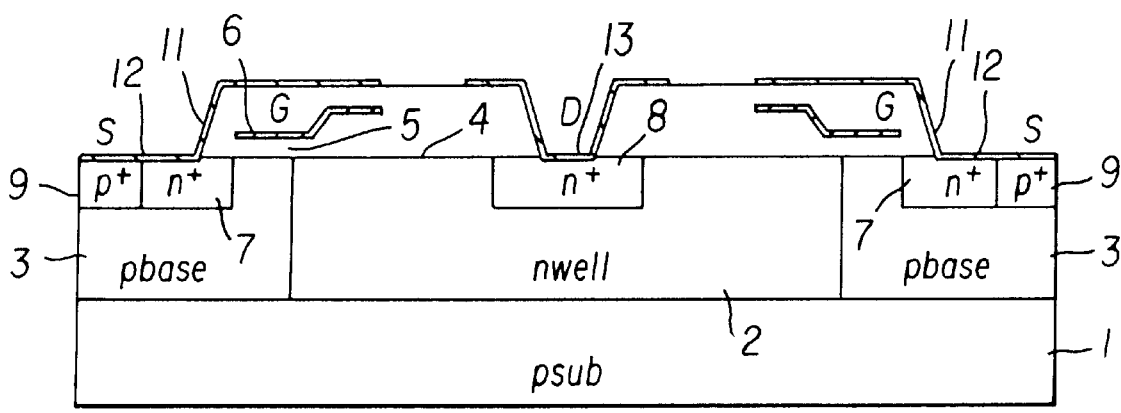
FIGS. 2(a)–2(c) are cross-sectional views showing principal parts of the first embodiment of the present invention.
Figure 2B:
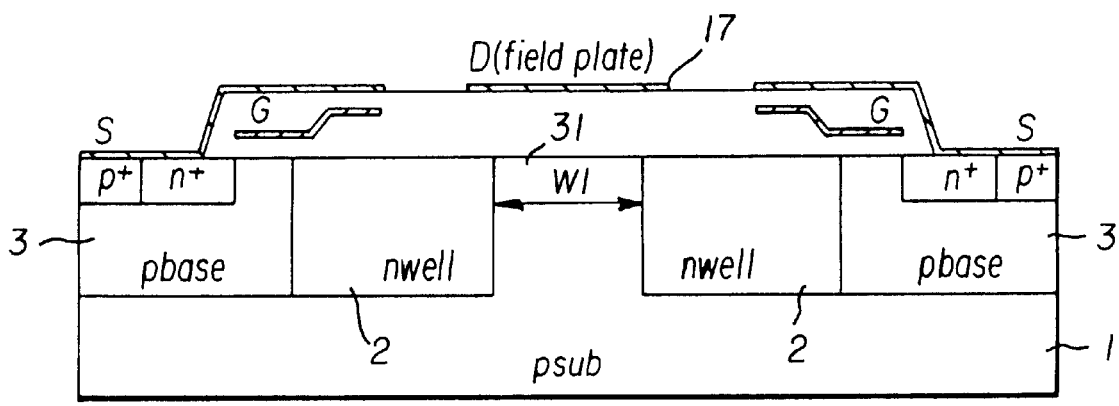
Figure 2C:
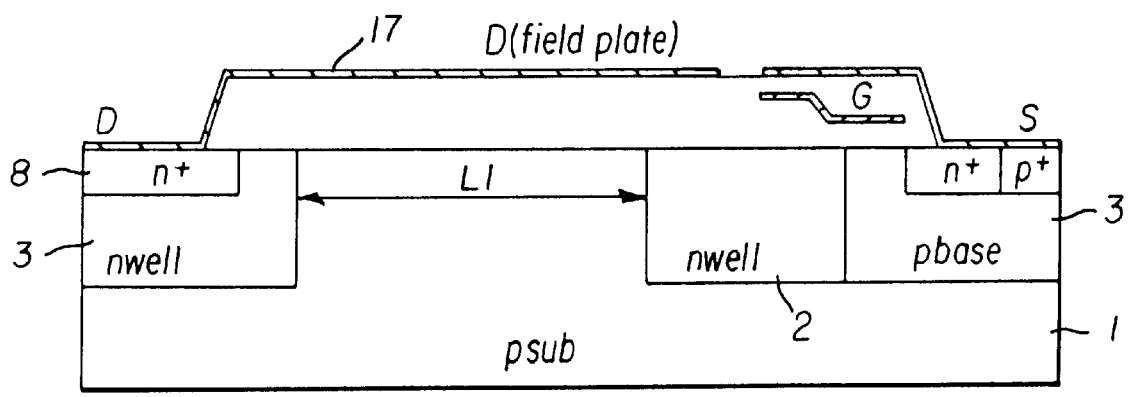

FIG. 1 is a plan view showing the first embodiment of the present invention, and FIGS. 2(a)–2(c) are cross-sectional views showing some parts of FIG. 1, wherein FIG. 2(a) is a cross-sectional view taken along line A-B of FIG. 1, FIG. 2(b) is a cross-sectional view taken along line C-D, and FIG. 2(c) is a cross-sectional view taken along line E-F. According to the first embodiment, an N well 2 and a P base 3 are formed on a high resistivity of about 150 Ωcm as shown in FIG. 2(a). The N well 2 has a surface concentration of $1 \times 10^{16}/cm^3$, and a diffusion depth of 6 μm. The amount of donor in the N well is $1 \times 10^{12}/cm^2$. The amount of donor in the N well 2, the resistivity of a P type substrate 1, the distance of drift regions are optimized to achieve a high voltage. The P type substrate 1 has an impurity concentration of $1 \times 10^{14}/cm^3$, and the P base 3 has a surface concentration of $3 \times 10^{16}/cm^3$ and a diffusion depth of 6 μm. A threshold voltage of a power MOS is determined according to the surface concentration. Then, a thermal oxide film 4 with a thickness of 0.6 μm, and a polysilicon gate 6 is formed through a gate oxide film 5 of 25 nm.

An n+ diffusion layer with a surface concentration of $1 \times 10^{20}/cm^3$ and a diffusion depth of 0.2 μm is formed in a source 7 and a drain 8, and a contact p+ diffusion layer 9 (with a surface concentration of $5 \times 10^{19}/cm^3$ and a diffusion depth of 0.5 μm) is formed on a surface of the p base 3 to thereby form an interlayer insulating film. A source electrode 12 and a drain electrode 13 are formed after a contact hole 11 is opened. In this embodiment, the source and drain electrodes are shaped like the teeth of a comb in order to improve a current driving performance. If there is a need for an actual output current capacity of 2–5A class, a channel width must be not less than 50 mm and the number of teeth of the comb is more than 10 and less than 20. Therefore, the p base 3 (the first-conductivity-type diffused region) and the drain (the second-conductivity-type diffused region) have a straight portion 20 with uniform interval, and corner parts 21, 22 are formed at an end portion of the straight portion 20.

As shown in FIG. 1 and FIGS. 2(b) and 2(c), a drain corner part 22B has an electronic field relieving structure. In this structure, the interval between the p base 3 and the drain 8 at the drain corner part 22B is larger than the interval in the other straight portions, and the conductivity characteristics of the N well 2 are partially different in a region with the larger interval.

Figure 18:
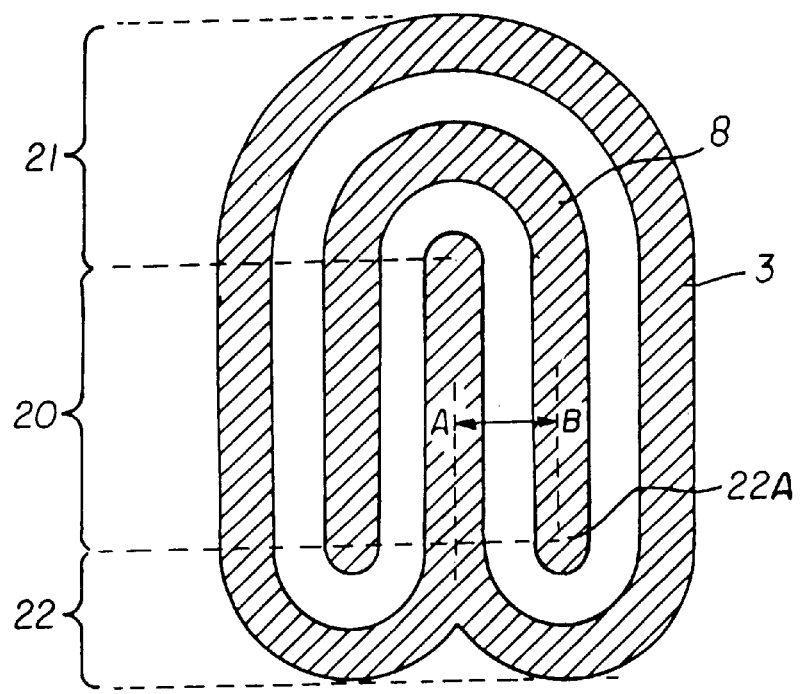
FIG. 18 is a sectional view showing the first prior art embodiment.
Figure 19:
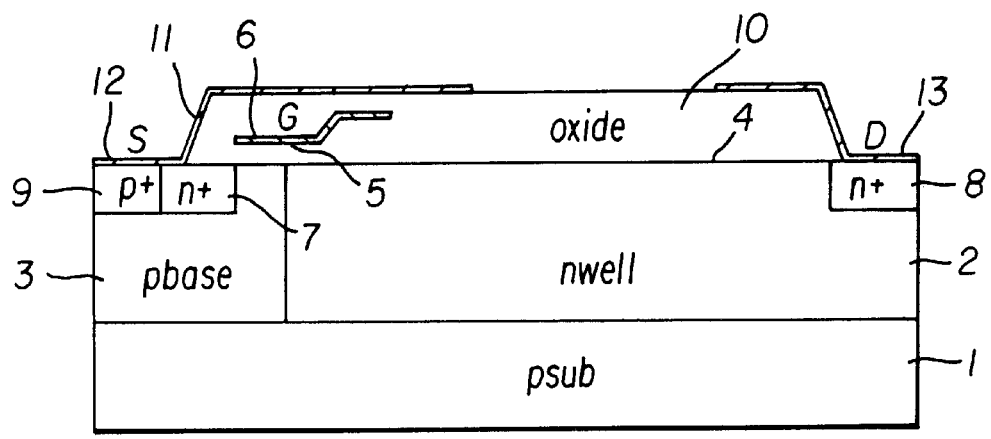
FIG. 19 is a sectional view showing the first prior art embodiment.
Figure 20:
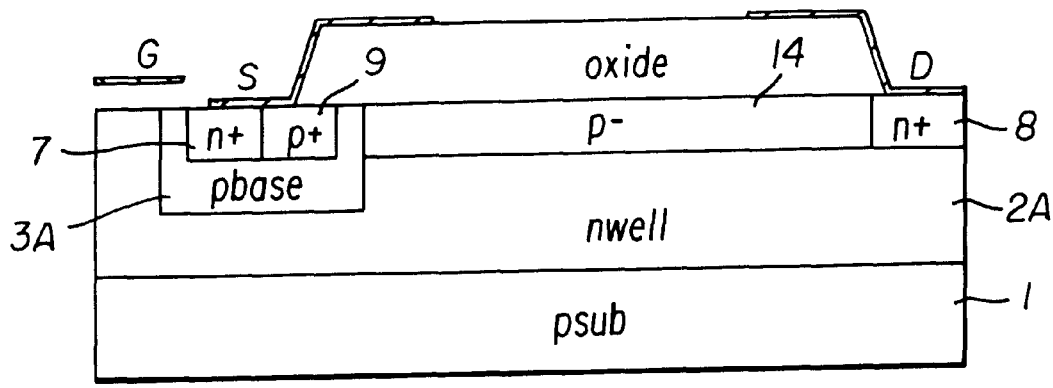
FIG. 20 is a sectional view showing the second prior art embodiment.
Figure 21:
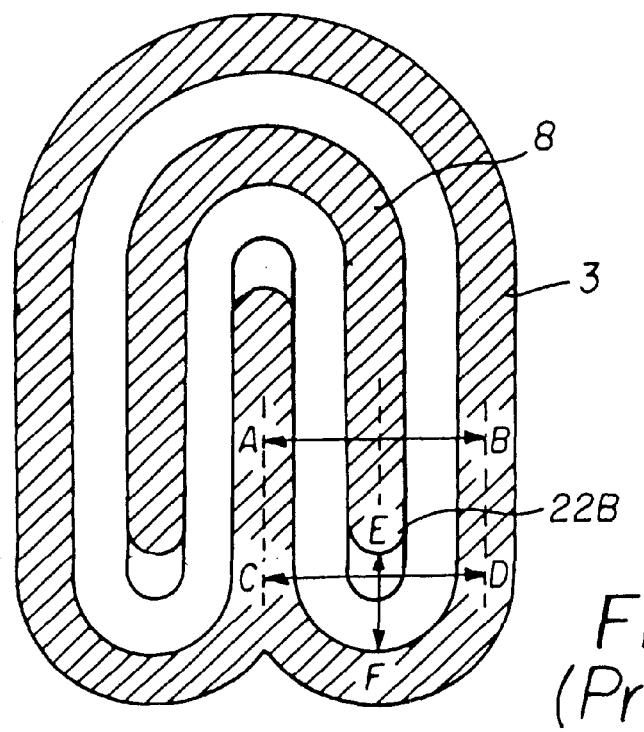
FIG. 21 is a plan view showing the third prior art embodiment.
Figure 22A:
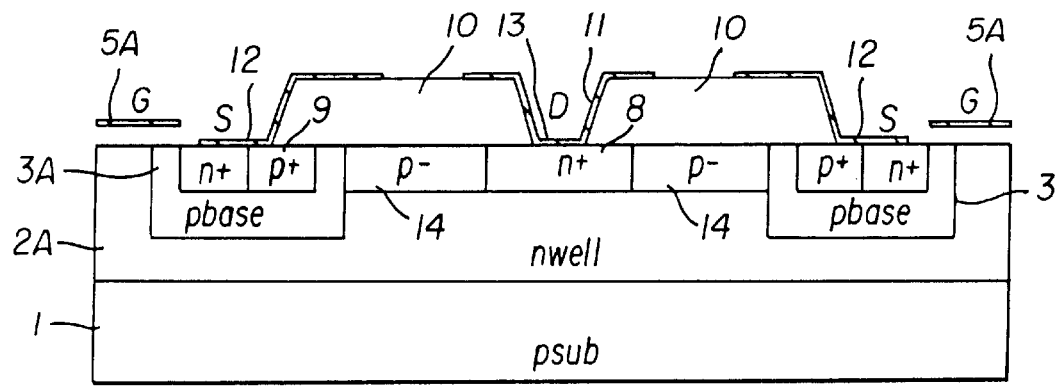
FIGS. 22(a)–22(c) are cross-sectional views showing the third prior art embodiment.
Figure 22B:
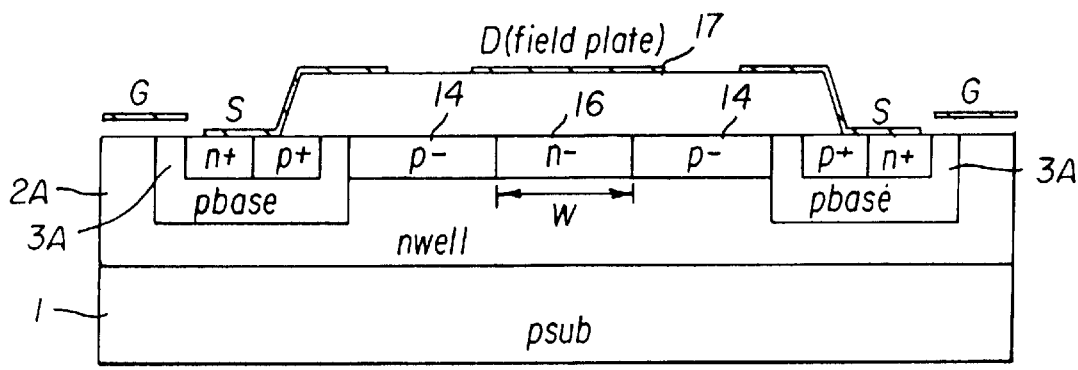
Figure 22C:
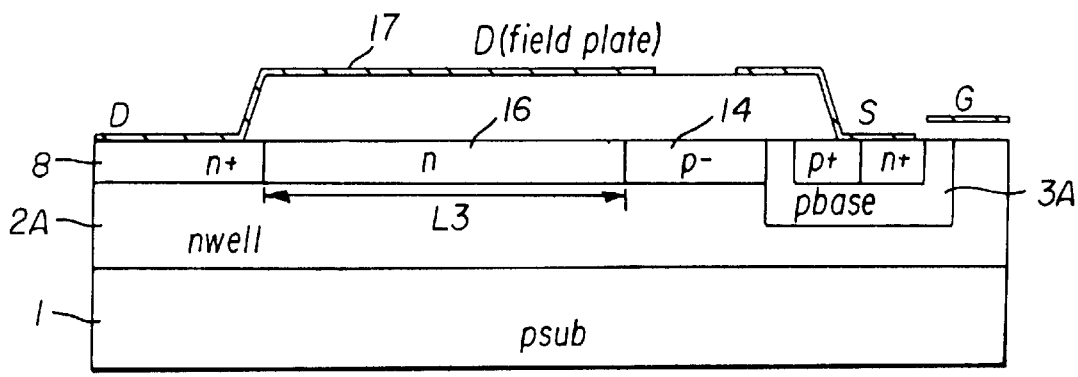

More specifically, the N well of the prior art shown in FIG. 18 is eliminated along a length L1 and a width W1, and the width W1 in the eliminated region (the region with the larger interval) is optimized to relieve the electric field at the corner part according to the first embodiment. As shown in FIG. 2(c), the eliminated region is a p type region (a p type substrate of a first-conductivity-type) 31, and a field plate 17 extending from the drain electrode covers the end portion in such a way as to reach the N well 2 at the end portion. In this structure, a depletion layer spreads in the p type substrate 1, which appears due to the elimination of the N well). Since the P type substrate 1 has a high resistivity, the electric field can be relieved uniformly and an optimum value of W1 can be determined in a relatively wide range in the achievement of the high voltage.

In an experiment, L1 was fixed at 50 μm, and W1 was subject to change. The breakdown voltage of the corner part depends on W1. If W1 was 25 μm, the breakdown voltage was 770V. At this time, the radius of curvature at the drain corner part 22 is 12.5 μm. This structure reduces a device pitch and lowers an ON resistance per unit area by 40%.

In this embodiment, the p type substrate 1 is used for the region (a p type region 31) with the width W1; however, a p type region with a different concentration may be used instead of the p type substrate 1.

Needless to say, the optimum values of W1 and the diffusion depth are different according to the concentration. In this case, p type region 31 can selectively add implant p type impurities into the N well 2. For example, p type ions are implanted into a lower section of a field oxide film in order to isolate elements in a low-voltage element part.

Embodiment 2

According to the second embodiment, an N well as a second-conductivity-type well is formed on a p type substrate as a first-conductivity-type semiconductor substrate. A first-conductivity-type diffused region as a p base is formed outside the well, and a second-conductivity-type diffused region as a drain is formed inside the well. The first-conductivity-type diffused region and the second-conductivity-type diffused region are shaped like the teeth of a comb. The interval between the first-conductivity-type diffused region and the second-conductivity-type diffused region in a part where the second-conductivity-type forms an end portion of the teeth of the comb is larger than the interval in other straight portions. The second-conductivity-type well at the end portion is partially formed as a first-conductivity-type region.

Figure 3A:
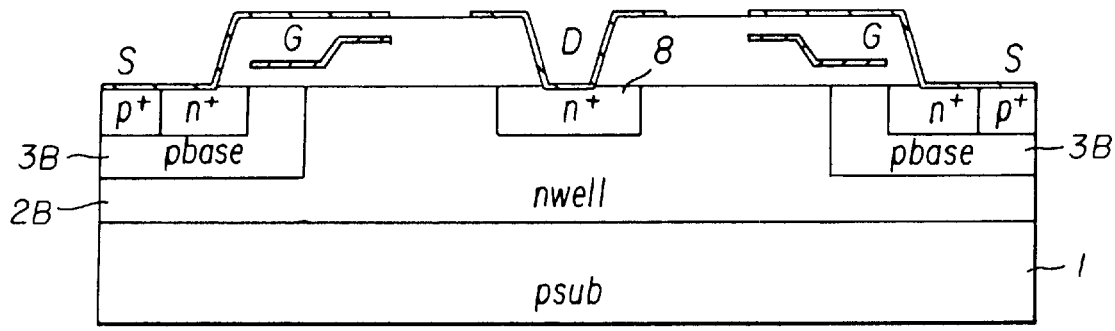
FIGS. 3(a)–3(c) are cross-sectional views showing principal parts of the second embodiment of the present invention.
Figure 3B:
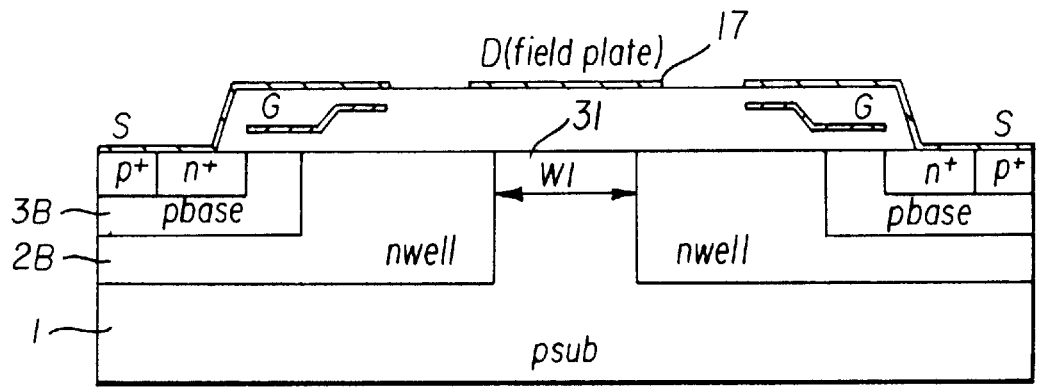
Figure 3C:
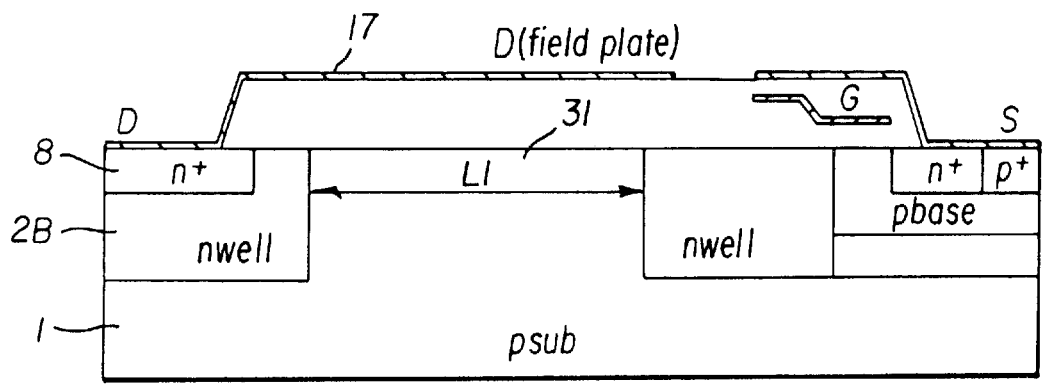

FIGS. 3(a)–3(c) are cross-sectional views showing principal parts of the second embodiment. The plan view of the second embodiment is the same as FIG. 1. The second embodiment is different from the first embodiment in that an N well 2B covers the whole source region (a P base 3B) as shown in FIG. 3. The P base 3B is shallow with a depth of 2 μm. The other structure of the second embodiment is the same as the first embodiment, and a description thereof will not be given here.

The above structure is characterized in that the double diffusion is performed by using a P base and an n+ source whose mask is a polysilicon gate to thereby shorten a channel length.

Embodiment 3

According to the third embodiment, an N well as a second-conductivity-type well is formed on a p type substrate as a first-conductivity-type semiconductor substrate. A first-conductivity-type diffused region as a p base is formed outside the well, and a second-conductivity-type diffused region as a drain is formed inside the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as a second-conductivity-type region with a different impurity concentration from that of the N well.

Figure 4A:
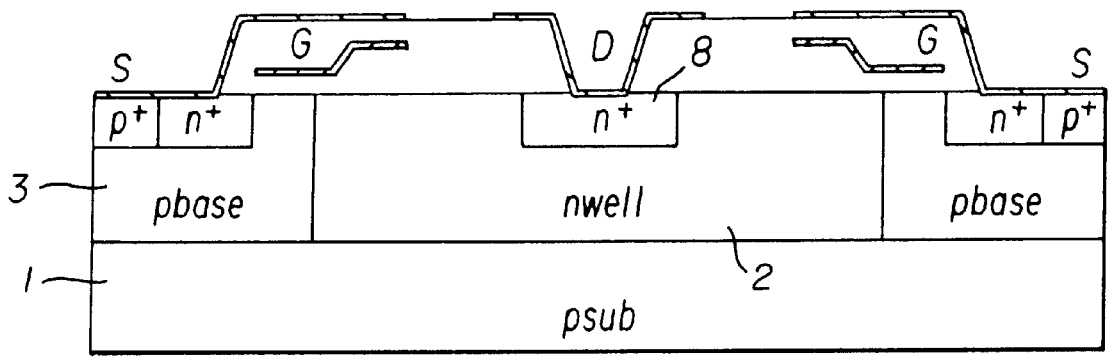
FIGS. 4(a)–4(c) are cross-sectional views showing principal parts of the third embodiment of the present invention.
Figure 4B:
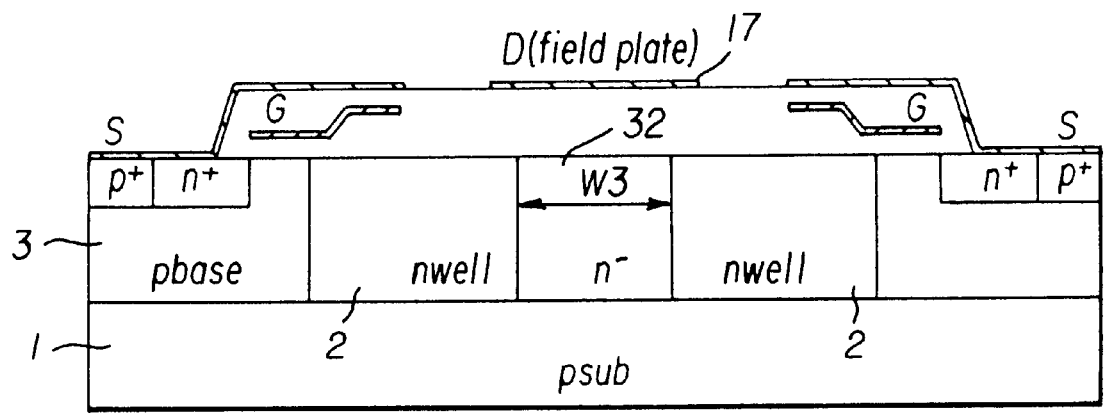
Figure 4C:
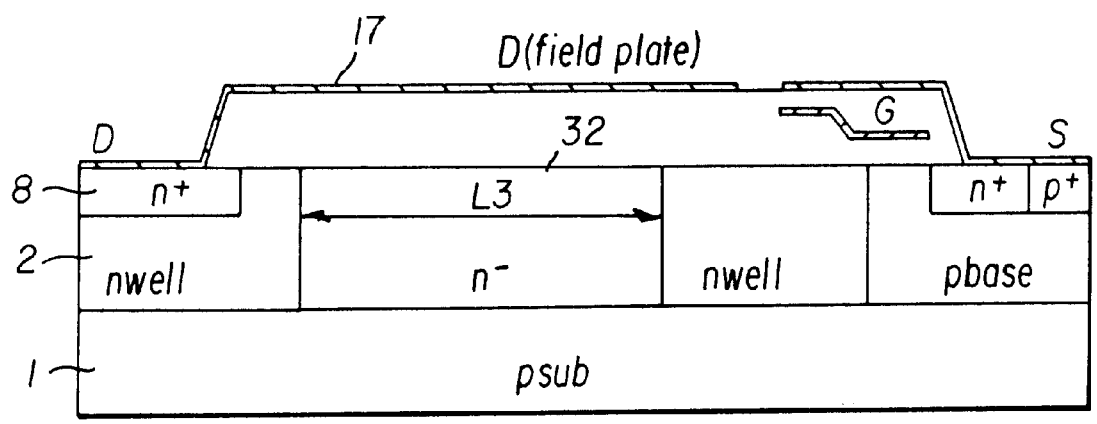

FIGS. 4(a)–4(c) are cross-sectional views showing principal parts of the third embodiment. The plan view of the third embodiment is the same as FIG. 1. The third embodiment is different from the first embodiment 1 in that the N well 2 with the larger interval (the drain corner end portion as shown in FIG. 18) is formed along a length L3 and a width W3 as an n type region 32 having a different impurity concentration from that of the N well 2. Otherwise, the third embodiment has the same structure as the first embodiment.

In this case, the optimum value of the width W3 differs according to the amount of impurities in the n type region 32 and the concentration of the p type substrate. In this embodiment, the n type region has an impurity concentration of $5 \times 10^{15}/cm^3$ for example. In an example of FIG. 4, the diffusion depth of the n type region is the same as that of the N well 2; however, it is needless to say that the diffusion depth of the n type region may be different from that of the N well 2.

Embodiment 4

According to the fourth embodiment, an n type well as a second-conductivity-type well is formed on a p type substrate as a first-conductivity-type semiconductor substrate. A P base as a first-conductivity-type diffused region is formed inside the well, and a drain as a second-conductivity-type diffused region is formed inside the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as a second-conductivity-type region with a different impurity concentration from that of the N well.

Figure 5A:
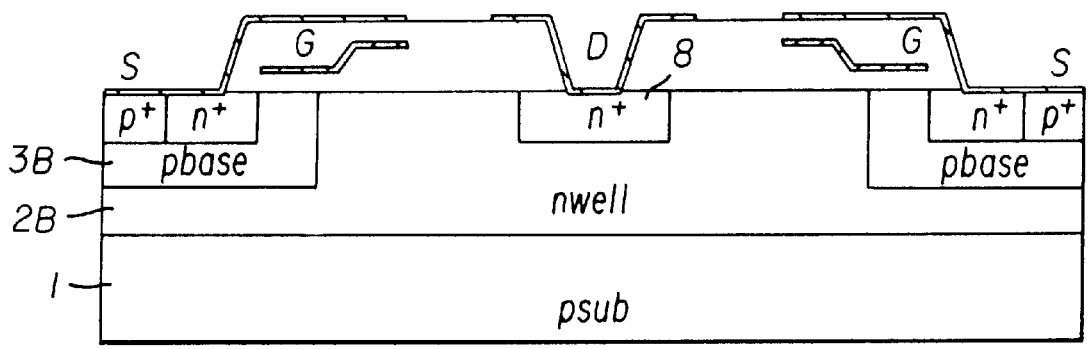
FIGS. 5(a)–5(c) are cross-sectional views showing principal parts of the fourth embodiment of the present invention.
Figure 5B:
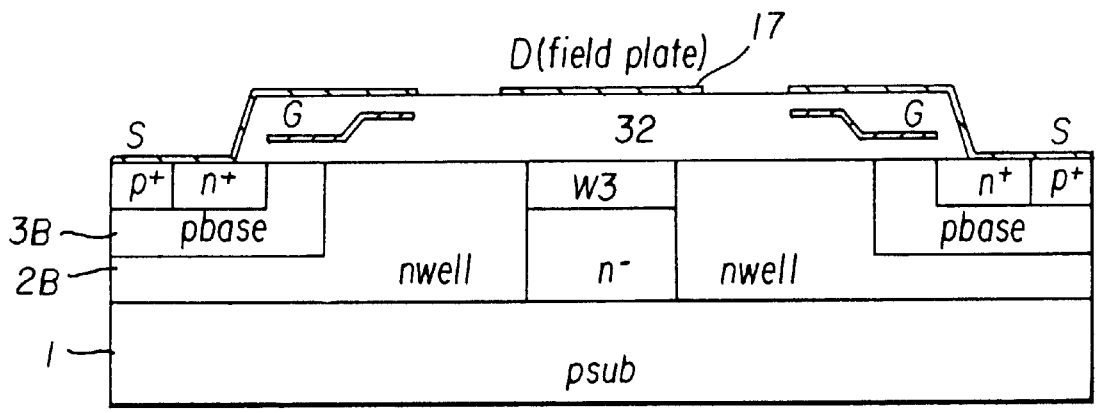
Figure 5C:
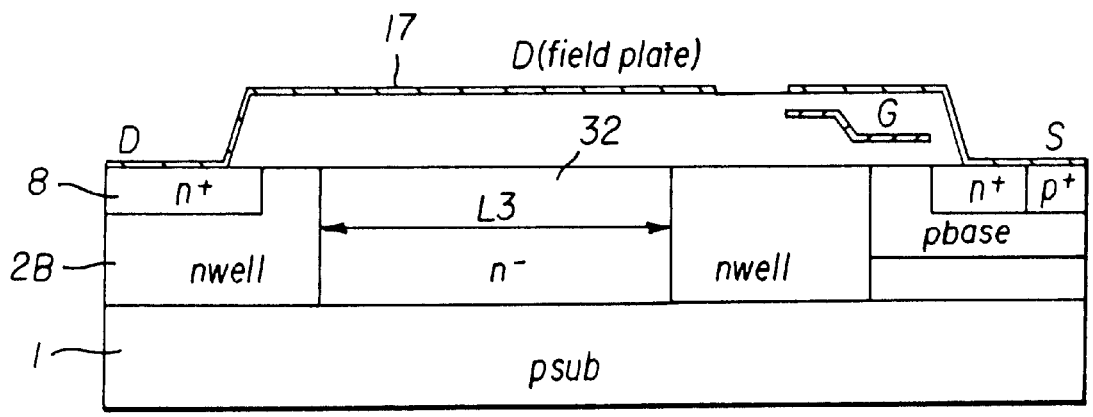

FIGS. 5(a)–5(c) are cross-sectional views showing principal parts of the fourth embodiment. A plan view thereof is the same as FIG. 1. The fourth embodiment is different from the third embodiment in that an N well 2B covers a source region (P base 3B). Therefore, the P base 3B has a shallow depth of 2 μm. Otherwise, the fourth embodiment has the same structure as the first embodiment.

Embodiment 5

According to the fifth embodiment, an N well as a second-conductivity-type well is formed on a p type substrate as a first-conductivity-type semiconductor substrate. A P base as a first-conductivity-type diffused region is formed outside the well, and a drain as a second-conductivity-type diffused region is formed inside the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as a second-conductivity-type region and a first-conductivity-type surface layer with a different impurity concentration from that of the N well.

Figure 6A:
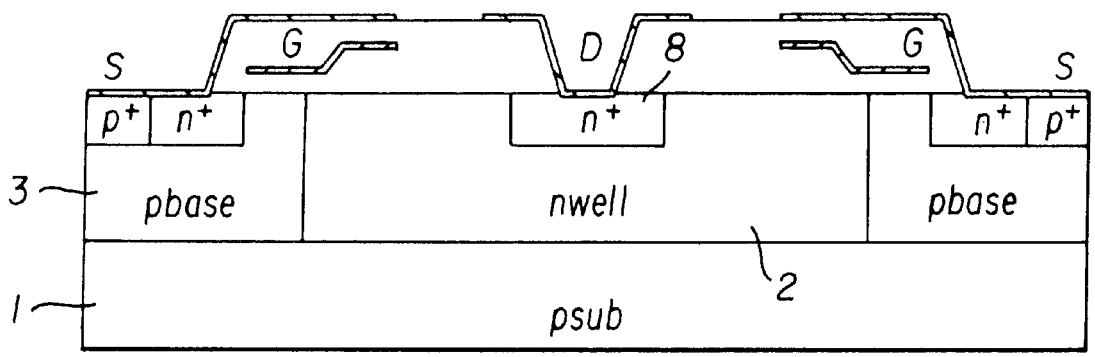
FIGS. 6(a)–6(c) are cross-sectional views showing principal parts of the fifth embodiment of the present invention.
Figure 6B:
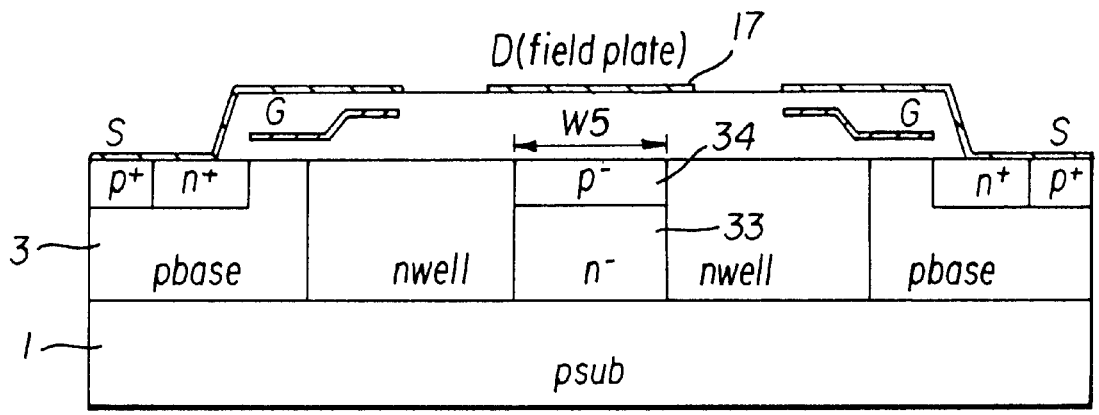
Figure 6C:
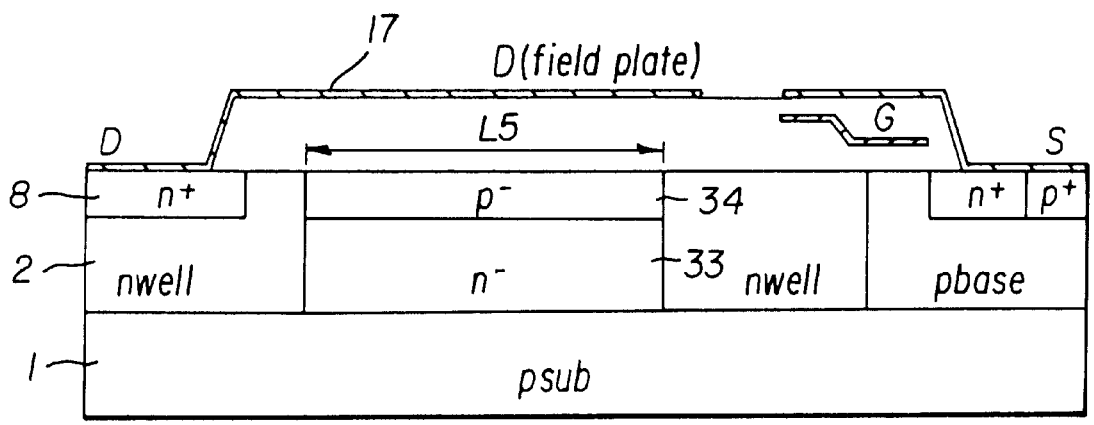

FIGS. 6(a)–6(c) are cross-sectional views showing principal parts of the fifth embodiment. A plan view thereof is the same as FIG. 1. The fifth embodiment is different from the first embodiment in that the N well 2 in the interval region is formed along a length L5 and a width W5 as an n type region 33 with a different impurity concentration from that of the N well 2 and a p type region 34 (the first-conductivity-type surface layer) formed at the top of the n type region 33. In FIGS. 6(a)–6(c), the total diffusion depth of the n type region 33 and the p type region 34 is the same as the diffusion depth of the N well, but it is needless to say that the diffusion depth of the n type region 33 and the p type region 34 varies according to the concentration thereof. Otherwise, the fifth embodiment has substantially the same structure as the first embodiment. In this case, the optimum value of the width W5 varies according to the amount of impurities in the p type region 34 and the concentration of the p type substrate 1.

According to the present embodiment, the width W5 is 2.5 μm, the impurity concentration of the p type region is $5 \times 10^{16}/cm^3$ and the impurity concentration of the n type region is $3 \times 10^{16}/cm^3$ Embodiment 6

According to the sixth embodiment, an N well as a second-conductivity-type well is formed on a p type substrate as a first-conductivity-type semiconductor substrate. A P base as a first-conductivity-type diffused region is formed inside the well, and a drain as a second-conductivity-type diffused region is formed inside the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as a second-conductivity-type region and a first-conductivity-type surface layer with a different impurity concentration from that of the N well.

Figure 7A:
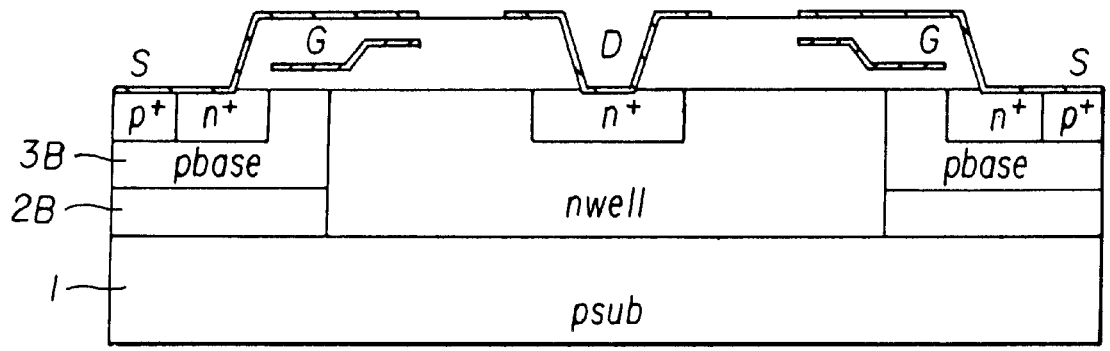
FIGS. 7(a)–7(c) are cross-sectional views showing principal parts of the sixth embodiment of the present invention.
Figure 7B:
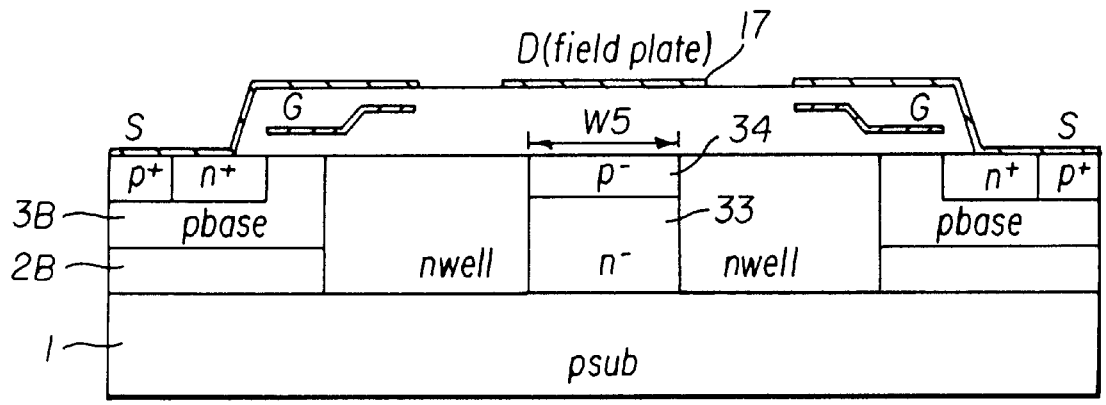
Figure 7C:
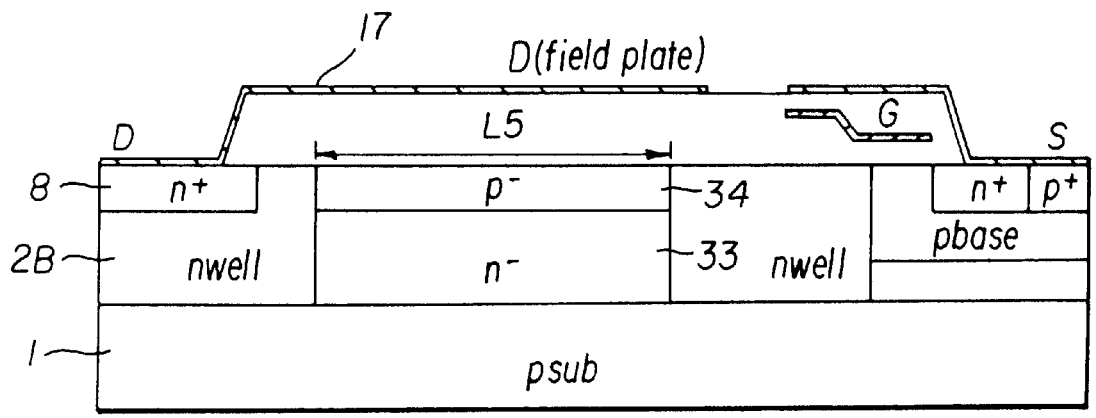

FIGS. 7(a)–7(c) are cross-sectional views showing principal parts of the sixth embodiment. A plan view thereof is the same as FIG. 1. The sixth embodiment is different from the fifth embodiment in that the N well 2B covers the whole source region (P base 3B). Therefore, the P base 3B has a shallow depth of 2 μm. Otherwise, the sixth embodiment has the same structure as the fifth embodiment, and a description thereof will not be given here.

Embodiment 7

According to the seventh embodiment, an N well as a second-conductivity-type well is formed on a p type substrate as a first-conductivity-type semiconductor substrate. A P base as a first-conductivity-type diffused region is formed outside the well, and a drain as a second-conductivity-type diffused region is formed inside the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as a plurality of first-conductivity-type regions and second-conductivity-type regions.

Figure 8A:
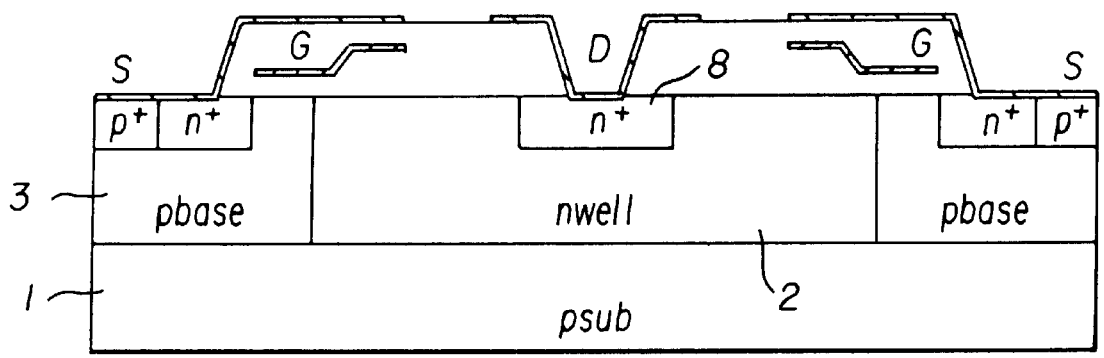
FIGS. 8(a)–8(c) are cross-sectional views showing principal parts of the seventh embodiment of the present invention.
Figure 8B:
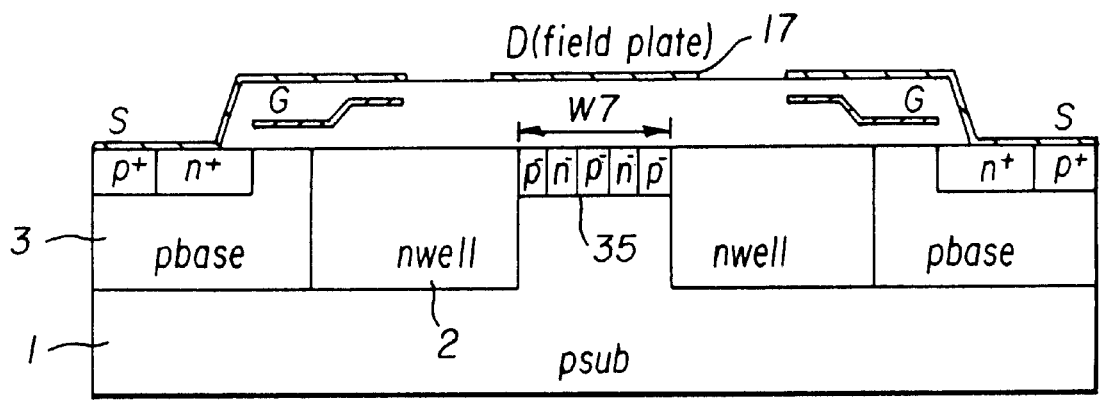
Figure 8C:
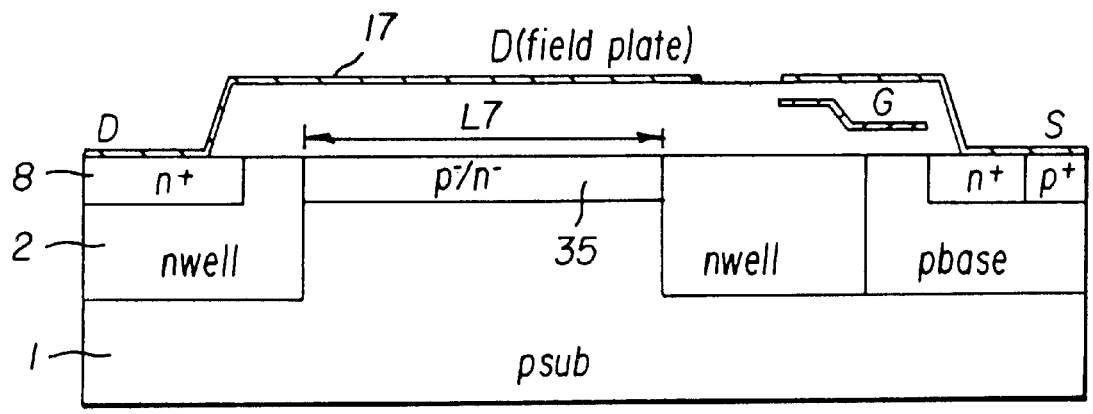

FIGS. 8(a)–8(c) are cross-sectional views showing principal parts of the seventh embodiment. A plan view thereof is the same as FIG. 1. According to the seventh embodiment, the N well 2 in the increased interval region is formed along a length L7 and a width W7 as a region 35 where a plurality of long and narrow p type and n type impurity regions are formed alternately. According to the present embodiment, the width W7 is 25 μm, and the impurity concentration of the p type and n type impurity regions is $1 \times 10^{16}/cm^3$.

A diffusion process for the formation of the N well 2 and the P base 3 in the cross-sectional structure of the principal part can also be used for the diffusion in those regions. This eliminates the necessity of increasing masking steps. Both diffused layers have a surface concentration of $10^{16}/cm^3$ and a depth of 6 μm. The maximum value of the breakdown voltage can be obtained at intervals of Wn=Wp=4 μm. Otherwise, the seventh embodiment has substantially the same structure as the first embodiment.

Embodiment 8

According to the eighth embodiment, an N well as a second-conductivity-type well is formed on a p type substrate as a first-conductivity-type semiconductor substrate. A P base as a first-conductivity-type diffused region is formed inside the well, and a drain as a second-conductivity-type diffused region is formed inside the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as a plurality of first-conductivity-type regions and second-conductivity-type regions.

Figure 9A:
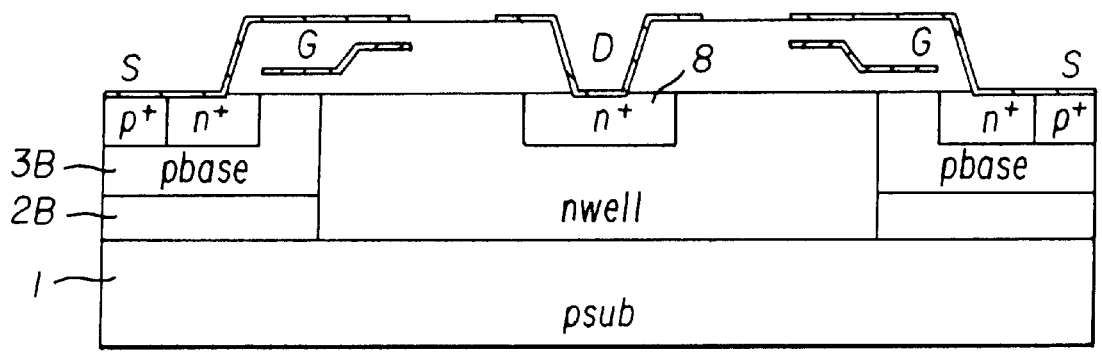
FIGS. 9(a)–9(c) are cross-sectional views showing principal parts of the eighth embodiment of the present invention.
Figure 9B:
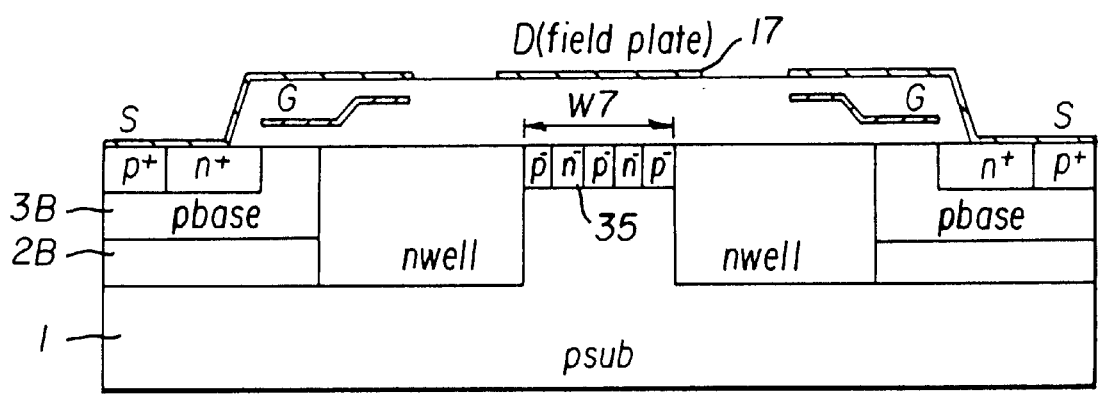
Figure 9C:
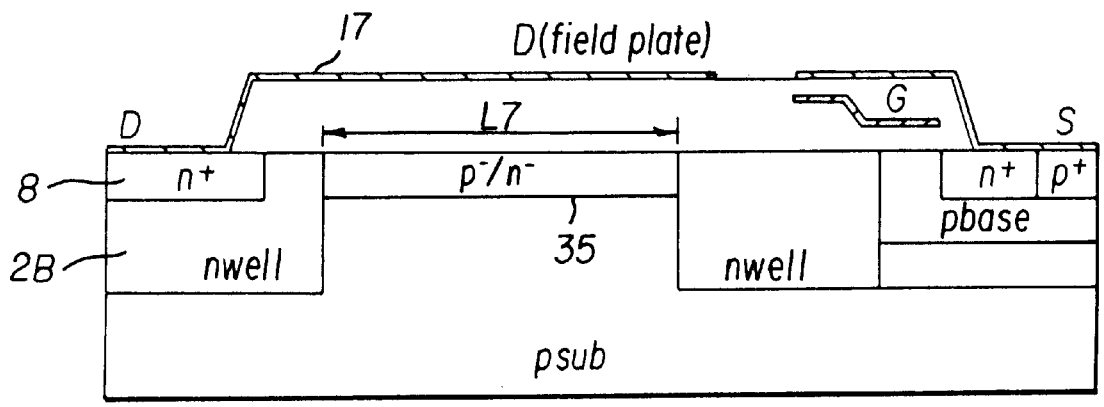

FIGS. 9(a)–9(c) are cross-sectional views showing principal parts of the eighth embodiment. A plan view thereof is the same as FIG. 1. The eighth embodiment is different from the seventh embodiment in that the N well 2B covers the whole source region (P base 3B). Therefore, the P base 3B has a shallow depth of 2 μm. Otherwise, the eighth embodiment has the same structure as the seventh embodiment.

Embodiment 9

According to the ninth embodiment, an N well as a second-conductivity-type well is formed on a p type substrate as a first-conductivity-type semiconductor substrate. A P base as a first-conductivity-type diffused region is formed outside the well, and a drain as a second-conductivity-type diffused region is formed inside the well. A first-conductivity-type diffused surface layer is formed on the surface of the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as a first-conductivity-type region.

Figure 10A:
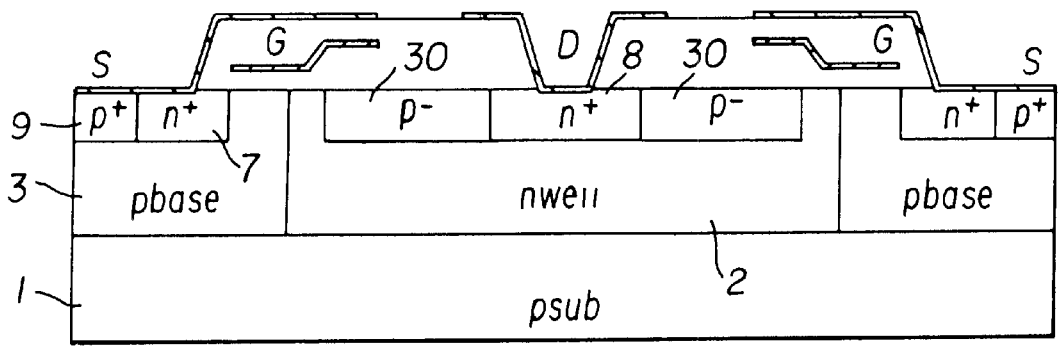
FIGS. 10(a)–10(c) are cross-sectional views showing principal parts of the ninth embodiment of the present invention.
Figure 10B:
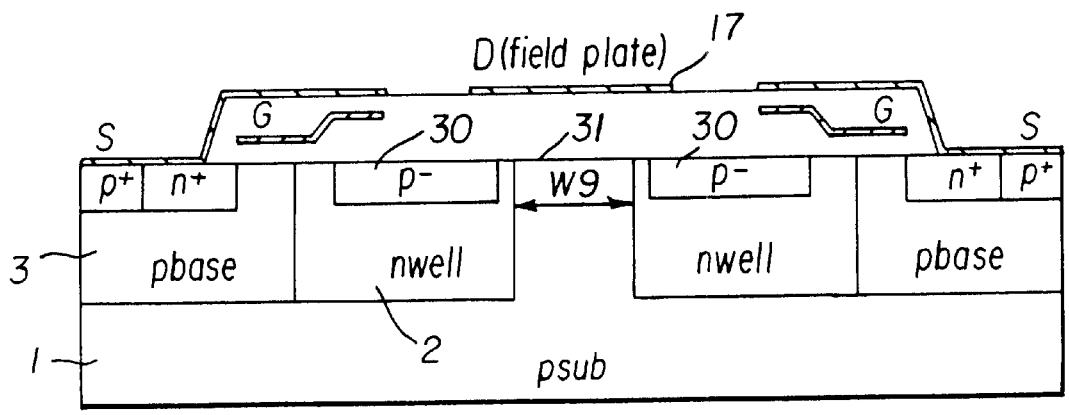
Figure 10C:
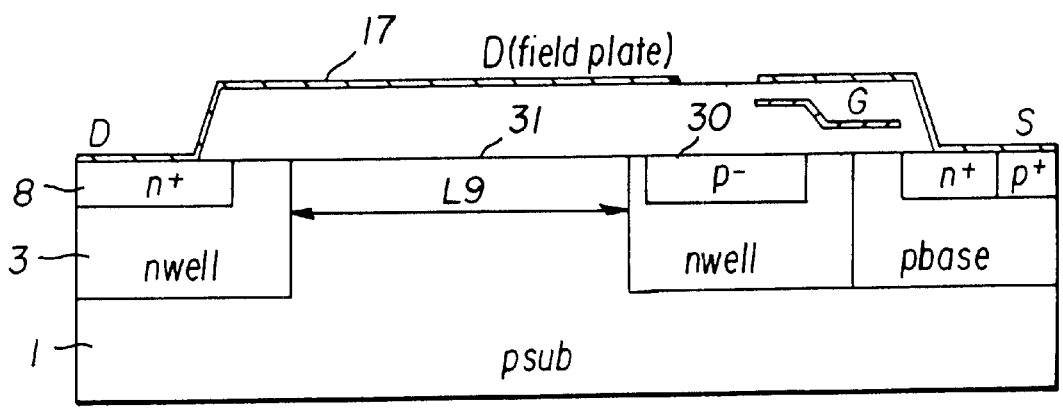

FIGS. 10(a)–10(c) are cross-sectional views showing principal parts of the ninth embodiment. A plan view thereof is the same as FIG. 1. According to the ninth embodiment, a P base 3 is formed outside an N well 2, and a p type surface layer (the first-conductivity-type diffused surface layer) 30 is provided between the P base 3 and an n+ drain 8 as shown in FIG. 10(a). The surface layer has a surface impurity concentration of $5 \times 10^{18}/cm^3$ and a diffusion depth of 1 μm. If the elements are in the ON state, a bias applied to a gate inverts the surface of the P base 3 just below the gate. An electronic current flows on the bottom surface of the p type surface layer in the N well 2 and flows into the $n^+$ drain 8. Otherwise, the ninth embodiment has substantially the same structure as FIG. 1, and a description thereof will not be given here.

According to this structure, a channel length can be long, and this inhibits the operation of a parasitic bipolar transistor that exists between the N well 2, the P base 3 and the source 7.

The drain corner part has an electronic field relieving structure. FIG. 10(b) is a cross-sectional view of the drain corner part along line C-D, and FIG. 10(c) is a cross-sectional view along line E-F. According to this structure, the interval between the P base 3 and the drain 8 is larger than the interval in the straight portions, and the N well 2 in the larger interval region is formed as a p type region 31, which is formed by eliminating the N well 2 along a length L9 and a width W9. The width W9 in this region is optimized to relieve the electronic field at the corner part. A field plate 17 extending from the drain electrode covers the end portion in such a manner as to reach the N well 2 at the end portion.

In an experiment, the length L9 was fixed at 50 μm, and the width W9 was subject to change. The breakdown voltage at the corner part depends on the width W9. If W9 is 25 μm, the maximum breakdown voltage was 770V. In this case, the radius of curvature at the drain corner part is 12.5 μm.

This arrangement reduces a device pitch, and lowers an ON resistance per unit area by 40%.

Embodiment 10

According to the tenth embodiment, an N well as a second-conductivity-type well is formed on a p type substrate as a first-conductivity-type semiconductor substrate. A P base as a first-conductivity-type diffused region is formed inside the well, and a drain as a second-conductivity-type diffused region is formed inside the well. A first-conductivity-type diffused surface layer is formed on the surface of the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as a first-conductivity-type region.

Figure 11A:
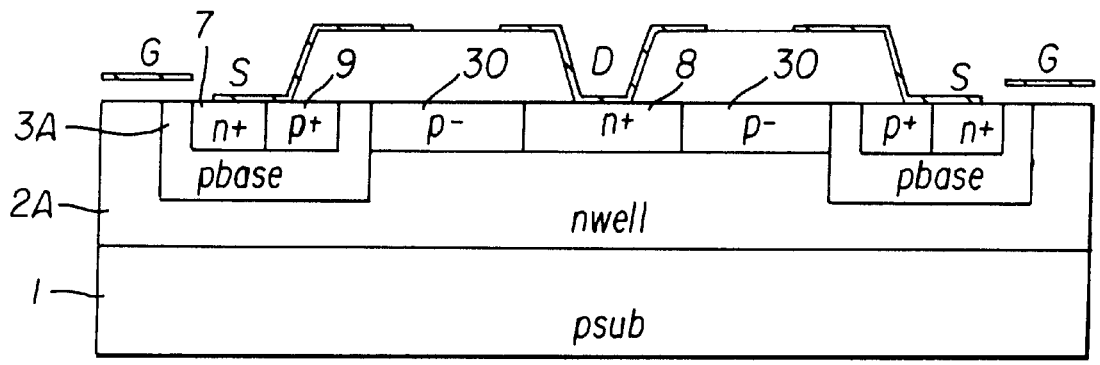
FIGS. 11(a)–11(c) are cross-sectional views showing principal parts of the tenth embodiment of the present invention.
Figure 11B:
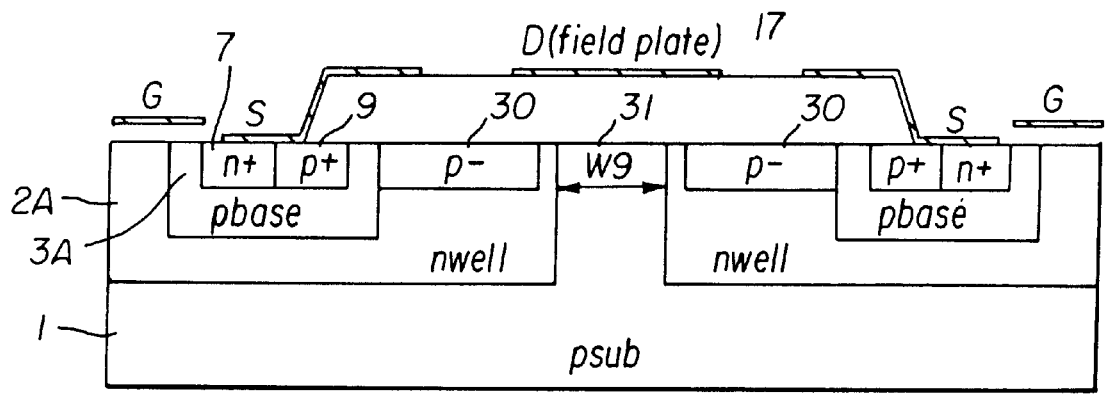
Figure 11C:
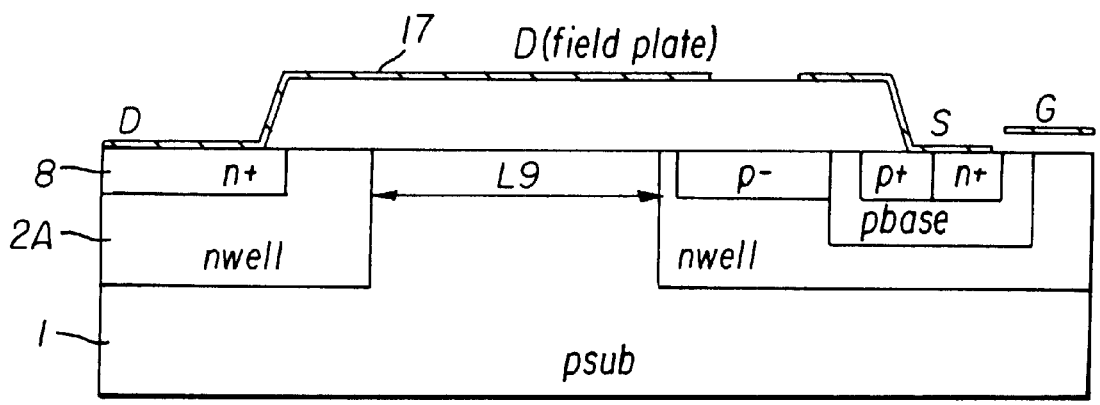

FIGS. 11(a)–11(c) are cross-sectional views showing principal parts of the tenth embodiment. A plan view thereof is the same as FIG. 1. The tenth embodiment is different from the ninth embodiment in that the P base 3A is formed inside the N well 2A. Therefore, the P base 3B has a shallow depth of 2 μm. The positions of the $p^+$ diffused layer 9 and the source 7

The drain corner part is structured in the same manner as the ninth embodiment, and a description thereof will not be given here.

Embodiment 11

According to the eleventh embodiment, an N well as a second-conductivity-type well is formed on a p type substrate as a first-conductivity-type semiconductor substrate. A P base as a first-conductivity-type diffused region is formed outside the well, and a drain as a second-conductivity-type diffused region is formed inside the well. A first-conductivity-type diffused surface layer is formed on the surface of the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The impurity concentration of the second-conductivity-type well at the end portion is partially different from that of the N well.

Figure 12A:
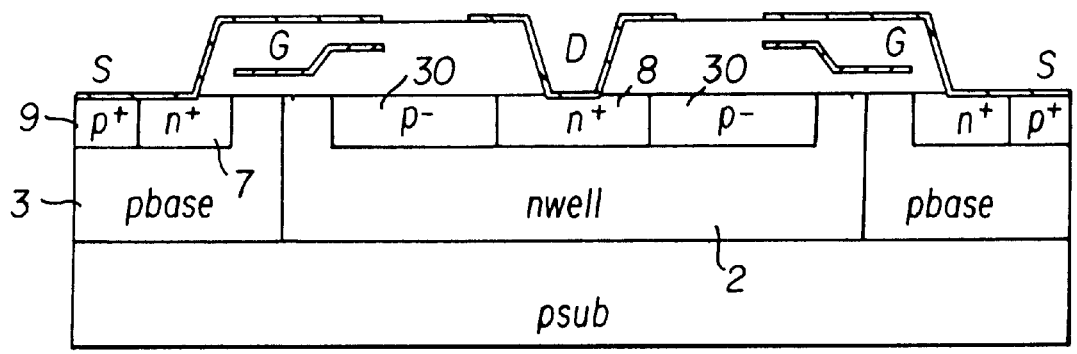
FIGS. 12(a)–12(c) are cross-sectional views showing principal parts of the eleventh embodiment of the present invention.
Figure 12B:
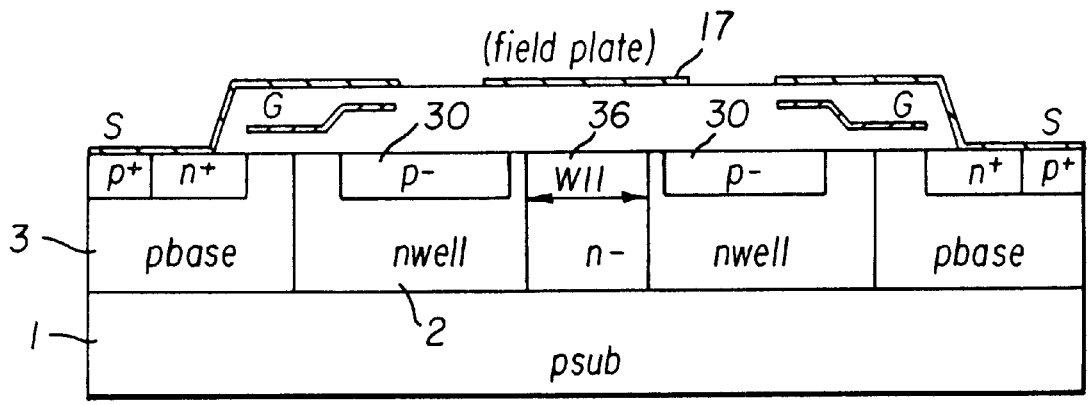
Figure 12C:
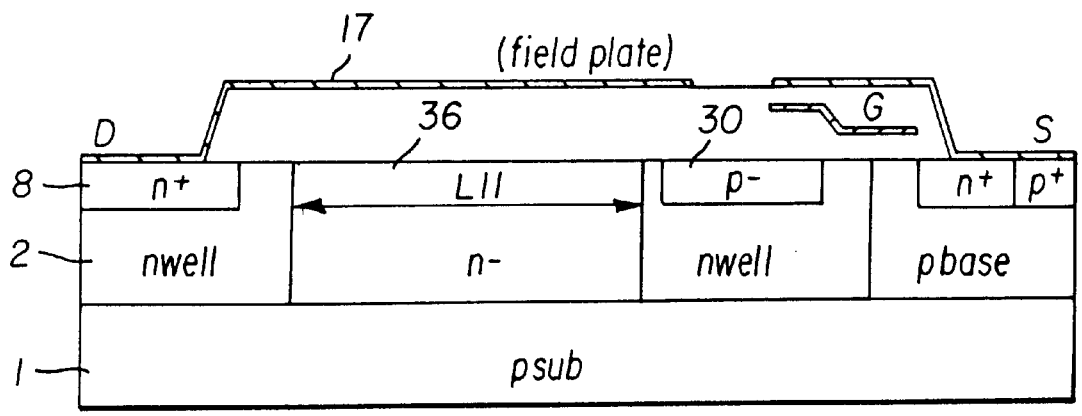

FIGS. 12(a)–12(c) are cross-sectional views showing principal parts of the eleventh embodiment. A plan view thereof is the same as FIG. 1. According to the eleventh embodiment, the N well 2 in the larger interval between the P base 3 and the drain 8 is formed along a length L11 and a width W11 as an n type region 36 having a different impurity concentration from that of the N well 2. The n type region has a surface impurity concentration of $5 \times 10^{15}/cm^3$. In FIG. 12, the n type region has the same diffusion depth as the N well 2, but it is needless to say that they may be different. Otherwise, the eleventh embodiment has substantially the same structure as the ninth embodiment, and a description thereof will not be given here.

Embodiment 12

According to the twelfth embodiment, an N well as a second-conductivity-type well is formed on a p type substrate as a first-conductivity-type semiconductor substrate. A P base as a first-conductivity-type diffused region is formed inside the well, and a drain as a second-conductivity-type diffused region is formed inside the well. A first-conductivity-type diffused surface layer is formed on the surface of the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The impurity concentration of the second-conductivity-type well at the end portion is partially different from that of the N well.

Figure 13A:
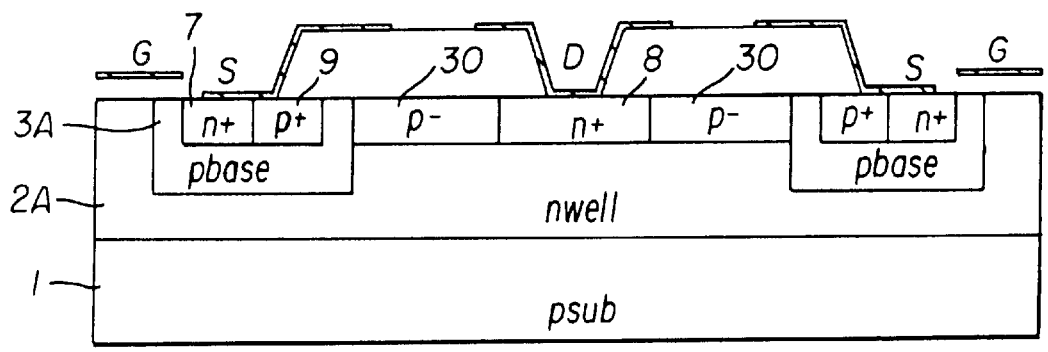
FIGS. 13(a)–13(c) are cross-sectional views showing principal parts of the twelfth embodiment of the present invention.
Figure 13B:
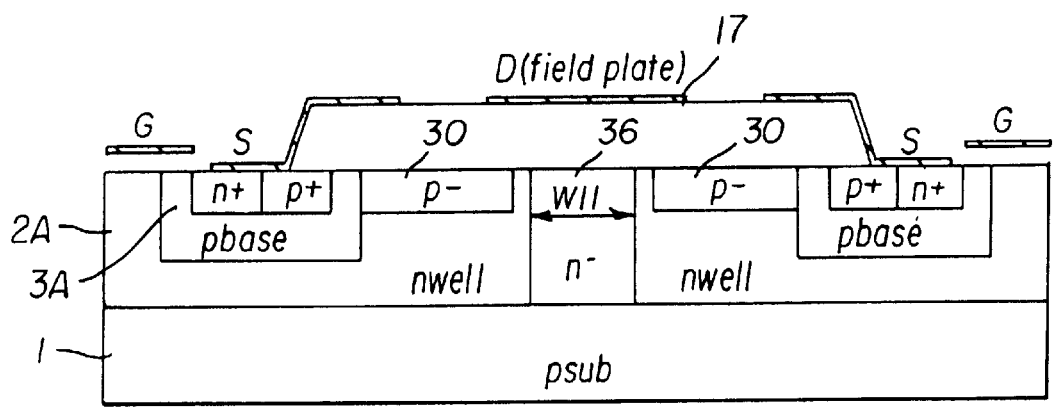
Figure 13C:
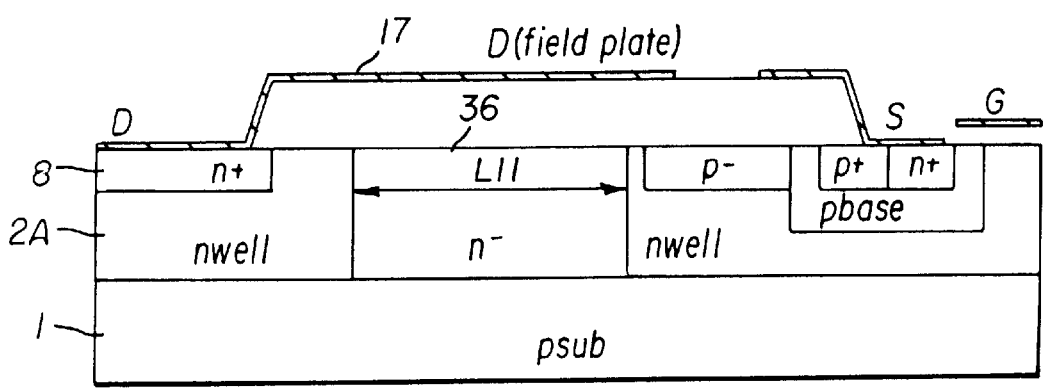

FIGS. 13(a)–13(c) are cross-sectional views showing principal parts of the twelfth embodiment. A plan view thereof is the same as FIG. 1. The twelfth embodiment is different from the eleventh embodiment in that the P base 3A is formed inside the N well 2A. Therefore, the P base 3B has a shallow depth of 2 μm. The positions of the p+ diffused layer 9 and the source 7 formed in the P base 3A are reversed.

The drain corner part is structured in the same manner as the eleventh embodiment, and a description thereof will not be given here.

Embodiment 13

According to the thirteenth embodiment, an N well as a second-conductivity-type well is formed on a p type substrate as a first-conductivity-type semiconductor substrate. A P base as a first-conductivity-type diffused region is formed outside the well, and a drain as a second-conductivity-type diffused region is formed inside the well. A first-conductivity-type diffused surface layer is formed on the surface of the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as the second-conductivity-region having a different impurity concentration from that of the N well and the first-conductivity-type surface layer having an impurity concentration from that of the first-conductivity-type surface layer.

Figure 14A:
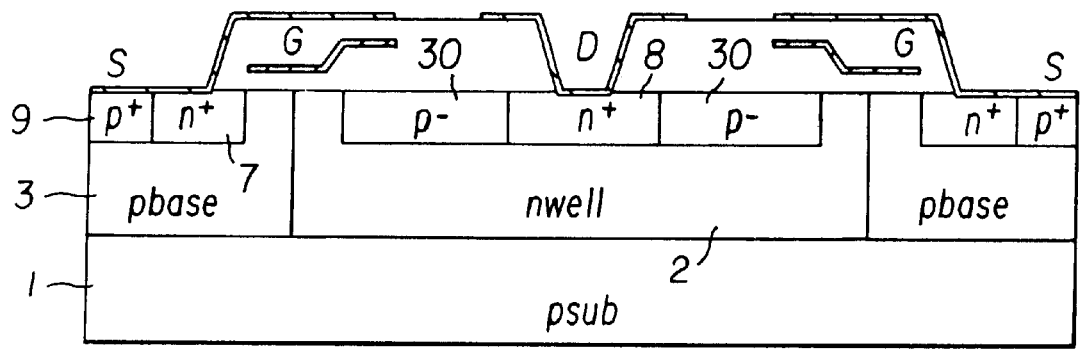
FIGS. 14(a)–14(c) are cross-sectional views showing principal parts of the thirteenth embodiment of the present invention.
Figure 14B:
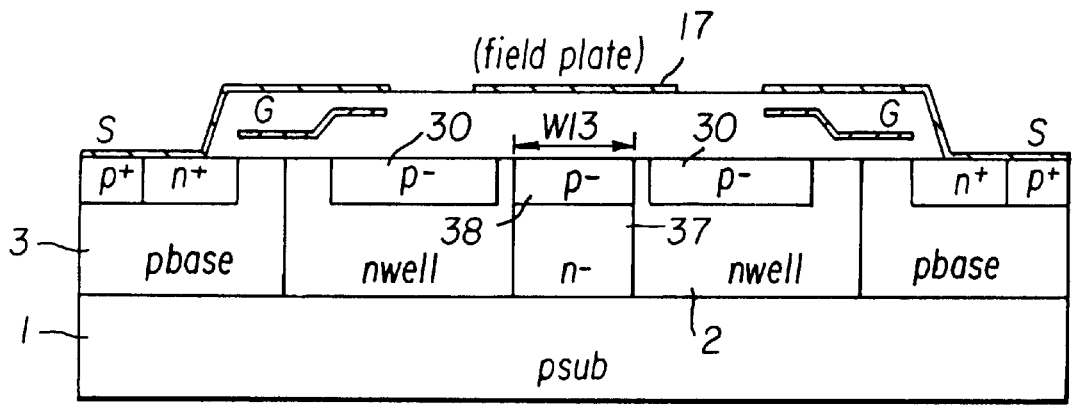
Figure 14C:
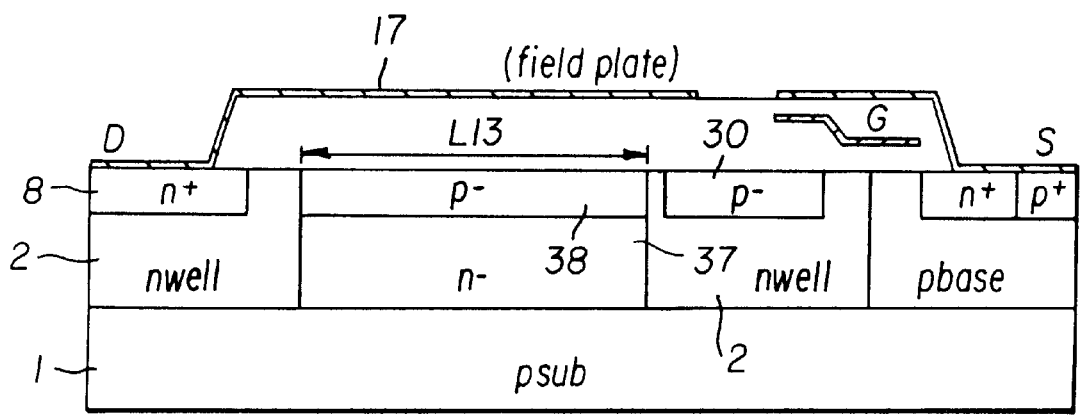

FIGS. 14(a)–14(c) are cross-sectional views showing principal parts of the thirteenth embodiment. A plan view thereof is the same as FIG. 1. The thirteenth embodiment is different from the ninth embodiment that the N well 2 in the larger interval region is formed as an n type region 37 with a different impurity concentration from that of the N well 2 and a p type region 38 (the first-conductivity-type surface layer) formed at the top of the n type region 37.

In this embodiment, the n type region 37 and the p type region 38 has the impurity concentration of $1 \times 10^{16}/cm^3$ for example. In FIG. 14, the total diffusion depth of the n type region 37 and the p type region 38 is the same as the diffusion depth of the N well 2, but this is only an example. Otherwise, the thirteenth embodiment has the same structure as the ninth embodiment, and a description thereof will not be described here.

Embodiment 14

According to the fourteenth embodiment, an N well as a second-conductivity-type well is formed on a p type substrate as a first-conductivity-type semiconductor substrate. A P base as a first-conductivity-type diffused region is formed inside the well, and a drain as a second-conductivity-type diffused region is formed inside the well. A first-conductivity-type diffused surface layer is formed on the surface of the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as the second-conductivity-region having a different impurity concentration from that of the N well and the first-conductivity-type surface layer having an impurity concentration from that of the first-conductivity-type surface layer.

Figure 15A:
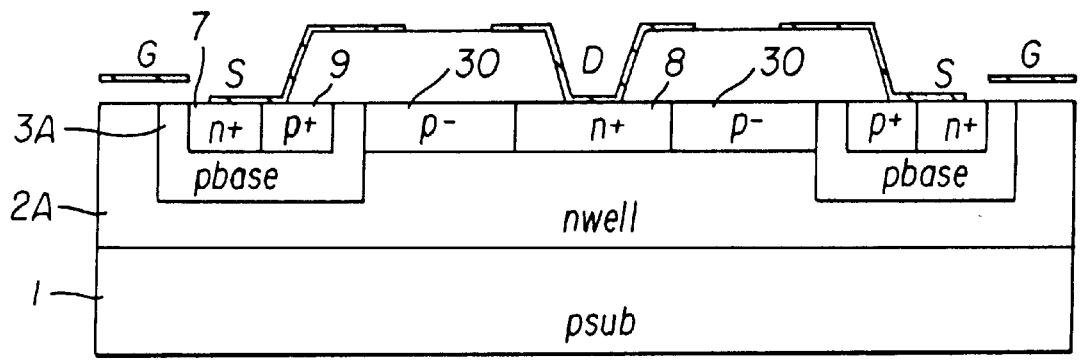
FIGS. 15(a)–15(c) are cross-sectional views showing principal parts of the fourteenth embodiment of the present invention.
Figure 15B:
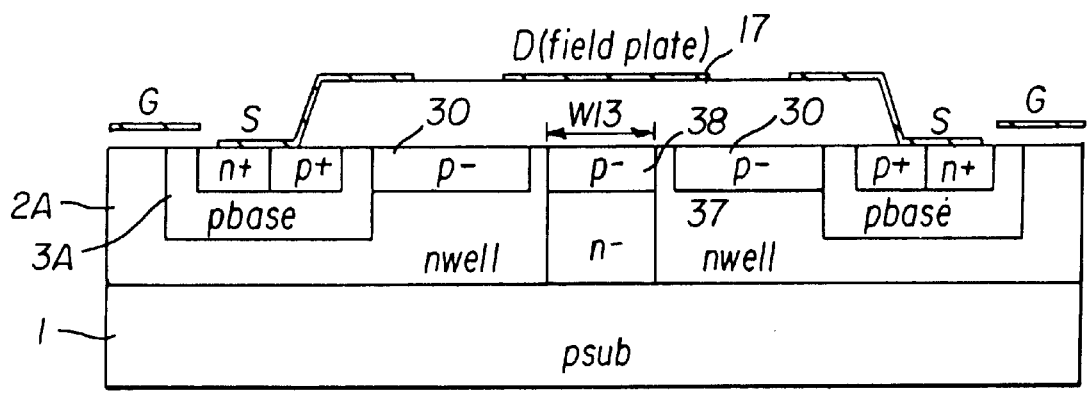
Figure 15C:
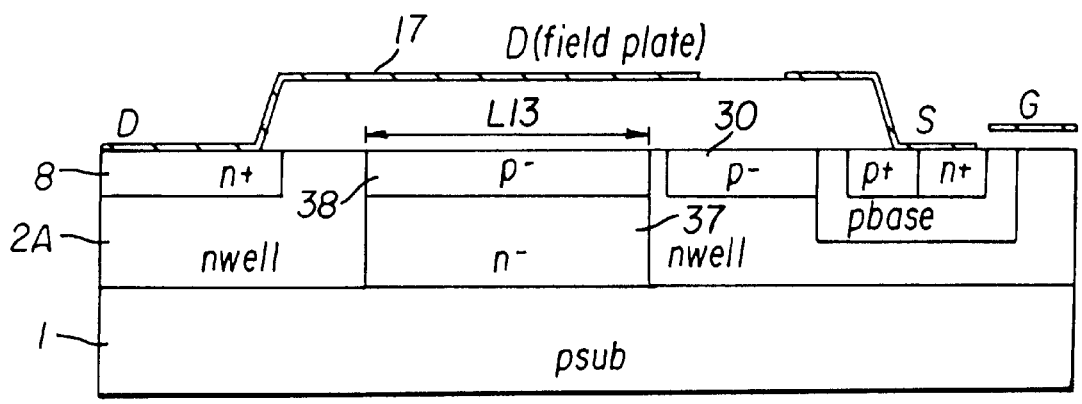

FIGS. 15(a)–15(c) are cross-sectional views showing principal parts of the fourteenth embodiment. A plan view thereof is the same as FIG. 1. The fourteenth embodiment is different from the thirteenth embodiment in that the P base 3A is formed inside the N well 2A. Otherwise, the fourteenth embodiment has the same structure as the thirteenth embodiment, and a description thereof will not be given here.

Embodiment 15

According to the fifteenth embodiment, an N well as a second-conductivity-type well is formed on a p type substrate as a first-conductivity-type semiconductor substrate. A P base as a first-conductivity-type diffused region is formed outside the well, and a drain as a second-conductivity-type diffused region is formed inside the well. A first-conductivity-type diffused surface layer is formed on the surface of the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as a plurality of first-conductivity-type regions and second-conductivity-type regions.

Figure 16A:
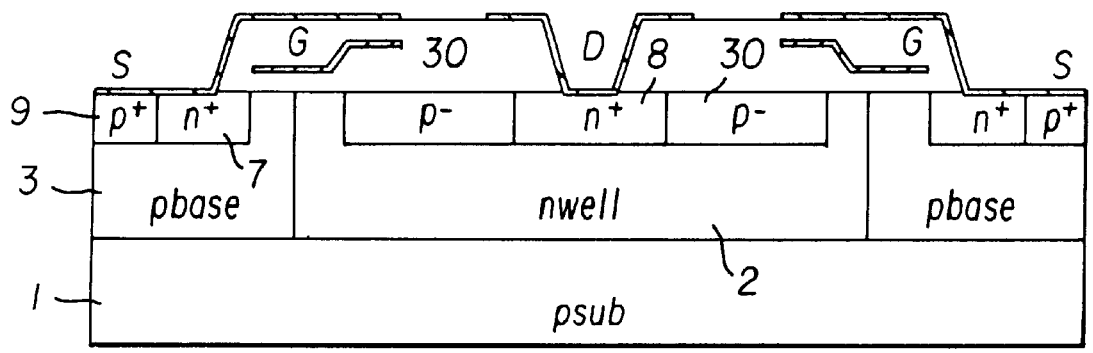
FIGS. 16(a)–16(c) are cross-sectional views showing principal parts of the fifteenth embodiment of the present invention.
Figure 16B:
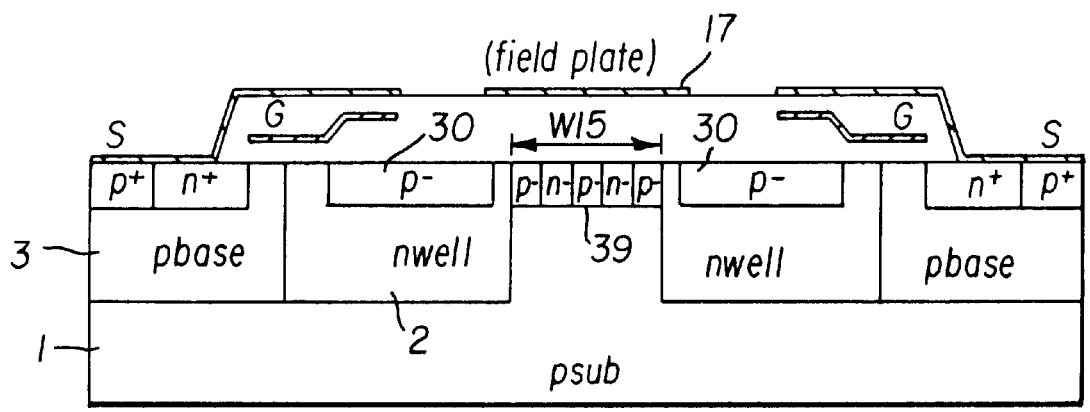
Figure 16C:
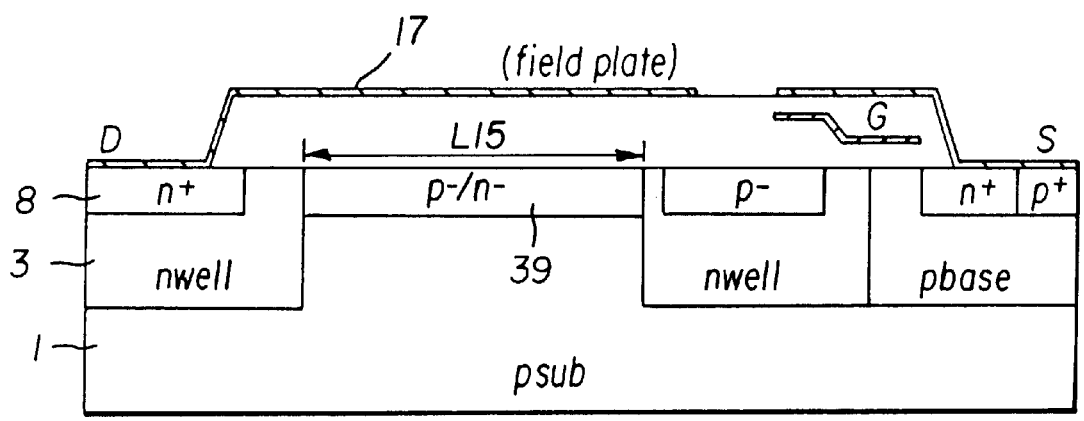

FIGS. 16(a)–16(c) are cross-sectional views showing principal parts of the fifteenth embodiment. A plan view thereof is the same as FIG. 1. According to the fifteenth embodiment, the N well 2 in the interval region is formed along a length L15 and a width W15 as a region 35 where a plurality of long and narrow p type and n type impurity regions are formed alternately. According to the present embodiment, the width W7 is, e.g., 25 μm, and the impurity concentration of the p type and n type impurity regions is, e.g., $1 \times 10^{16}/cm^3$.

A diffusion process for the formation of the N well 2 and the P base 3 in the cross-sectional structure of the principal part can also be used for the diffusion in those regions. This eliminates the necessity of increasing masking steps. Both diffused layers have a surface concentration of $10^{16}/cm^3$ and a depth of 6 μm. The maximum value of the breakdown voltage can be obtained at intervals of Wn=Wp=4 μm.

Embodiment 16

According to the sixteenth embodiment, an N well as a second-conductivity-type well is formed on a p type substrate as a first-conductivity-type semiconductor substrate. A P base as a first-conductivity-type diffused region is formed inside the well, and a drain as a second-conductivity-type diffused region is formed inside the well. A first-conductivity-type diffused surface layer is formed on the surface of the well. The first-conductivity-type diffused region and the second-conductivity-type diffused region are shaped like the teeth of a comb. The interval between the first-conductivity-type diffused region and the second-conductivity-type diffused region in a part where the second-conductivity-type diffused region forms an end portion of the teeth of the comb is larger than the interval in other straight portions. The second-conductivity-type well at the end portion is partially formed as a plurality of first-conductivity-type regions and second-conductivity-type regions.

Figure 17A:
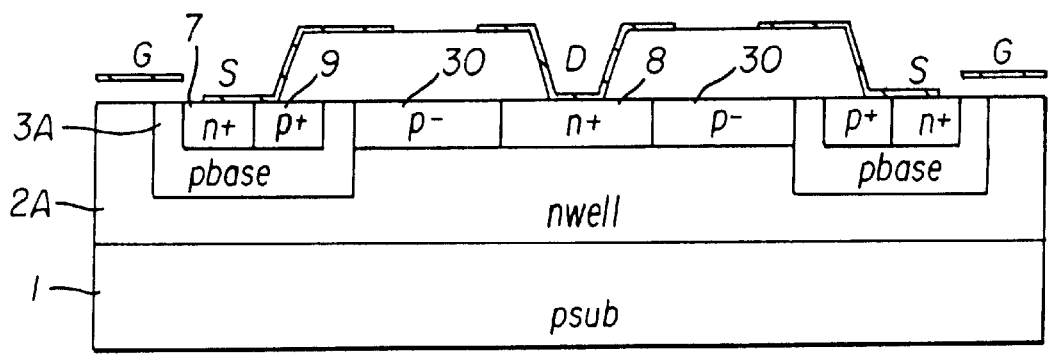
FIGS. 17(a)–17(c) are cross-sectional views showing principal parts of the sixteenth embodiment of the present invention.
Figure 17B:
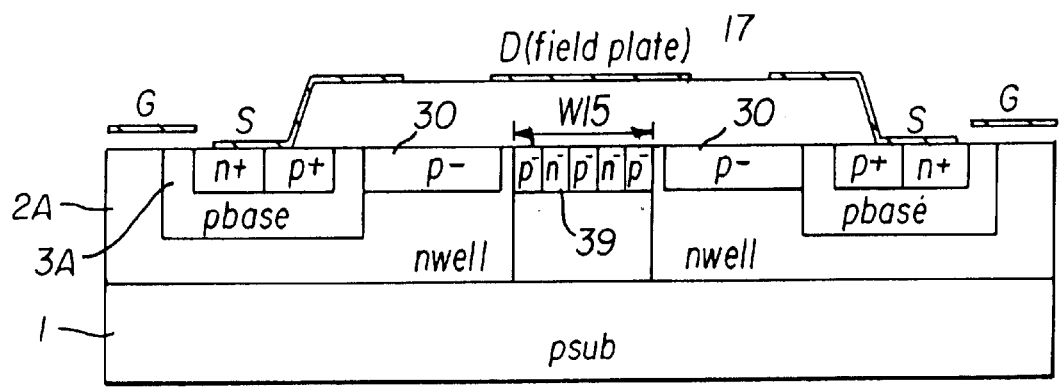
Figure 17C:
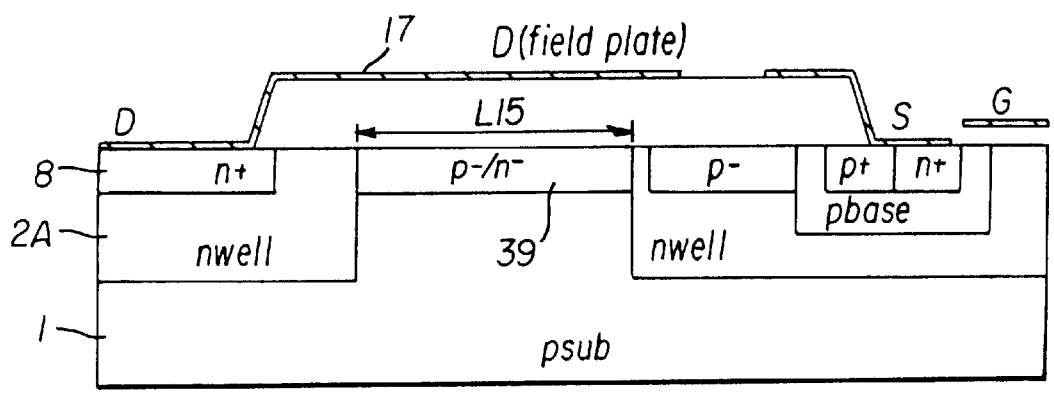

FIGS. 17(a)–17(c) are cross-sectional views showing principal parts of the sixteenth embodiment. The plan view thereof is the same as FIG. 1. The sixteenth embodiment is different from the fifteenth embodiment in that the N well 2b covers the whole source region (the P base 3B). Therefore, the P base 3B is shallow with a depth of 2 μm. Otherwise, the sixteenth embodiment has the same structure as the fifteenth embodiment, and a description thereof will not be given here.

As set forth hereinabove, the present invention is directed to a semiconductor device, in which a second-conductivity-type well is formed on a first-conductivity-type semiconductor substrate and a second-conductivity-type diffused region is formed inside the well, and in which a first-conductivity-type diffused region is formed at a desired position on the first-conductivity-type semiconductor substrate, the first-conductivity-type diffused region and the second-conductivity-type diffused region having straight portions with uniform interval, a corner part being formed at an end portion of the straight portions, the semiconductor device characterized in that: at the corner part in the second-conductivity-type diffused region, the interval between the first-conductivity-type diffused region and the second-conductivity-type diffused region is larger than the interval between the straight portions, and the conductivity characteristics in a larger interval region is different from those of the second-conductivity-type well along a predetermined width in order to relieve concentration of electric fields at the corner part. Therefore, the semiconductor device relieves the concentration of electric fields generated at the corner part and the like even if the integration degree of the device is improved, and thus easily improves the current driving performance by improving the integration degree.

The invention has been described with reference to certain preferred embodiments thereof. It will be understood that modification and variations are possible within the scope of the appended claims.

What is claimed is:

1. The semiconductor device, in which a second-conductivity-type well is formed on a first-conductivity-type semiconductor substrate and a second-conductivity-type diffused region is formed inside said well, and in which a first-conductivity-type diffused region is formed at a desired position on said first-conductivity-type semiconductor substrate, said first-conductivity-type diffused region and said second-conductivity-type diffused region having straight portions with uniform interval, a corner part being formed at an end portion of said straight portions, said semiconductor device characterized in that:
  at said corner part in said second-conductivity-type diffused region, the interval between said first-conductivity-type diffused region and said second-conductivity-type diffused region is larger than the interval between said straight portions, and conductivity characteristics in a larger interval region are different from conductivity characteristics of said second-conductivity-type well along a predetermined width in order to relieve concentration of electric fields at said corner part, and a field plate is connected to a potential of the second-conductivity-type diffused region, and covers the interval region.

2. The semiconductor device as defined in claim 1, wherein a first-conductivity-type region is formed along a predetermined width in said interval region.

3. The semiconductor device comprising:
  a first-conductivity-type semiconductor substrate;
  a second-conductivity-type well formed on said first-conductivity-type semiconductor substrate;
  a first-conductivity-type diffused region formed at a desired position on said first-conductivity-type semiconductor substrate; and
  a second-conductivity-type diffused region formed inside said second-conductivity-type well,
  wherein said first-conductivity-type diffused region and said second-conductivity-type diffused region have straight portions with uniform interval, and a corner part formed at an end portion of said straight portions,
  wherein at said corner part in said second-conductivity-type diffused region, the interval between said first-conductivity-type diffused region and said second-conductivity-type diffused region is larger than the interval between said straight portions, and conductivity characteristics in the larger interval region are different from conductivity characteristics of said second-conductivity-type well along a predetermined width in order to relieve concentration of electric fields at said corner part,
  wherein a second-conductivity-type region is formed along a predetermined width in said interval region, said second-conductivity-type region having a different impurity concentration from that of said second-conductivity-type well.

4. The semiconductor device comprising:
  a first-conductivity-type semiconductor substrate;
  a second-conductivity-type well formed on said first-conductivity-type semiconductor substrate;
  a first-conductivity-type diffused region formed at a desired position on said first-conductivity-type semiconductor substrate; and
  a second-conductivity-type diffused region formed inside said second-conductivity-type well,
  wherein said first-conductivity-type diffused region and said second-conductivity-type diffused region have straight portions with uniform interval, and a corner part formed at an end portion of said straight portions,
  wherein at said corner part in said second-conductivity-type diffused region, the interval between said first-conductivity-type diffused region and said second-conductivity-type diffused region is larger than the interval between said straight portions, and conductivity characteristics in the larger interval region are different from conductivity characteristics of said second-conductivity-type well along a predetermined width in order to relieve concentration of electric fields at said corner part,
  wherein a second-conductivity-type region and a first-conductivity-type surface layer formed thereon are formed along a predetermined width in said interval region, said second-conductivity-type region having a different impurity concentration from said second-conductivity-type well along a predetermined width.

5. The semiconductor device comprising:
a first-conductivity-type semiconductor substrate;
a second-conductivity-type well formed on said first-conductivity-type semiconductor substrate;
a first-conductivity-type diffused region formed at a desired position on said first-conductivity-type semiconductor substrate; and
a second-conductivity-type diffused region formed inside said second-conductivity-type well,
wherein said first-conductivity-type diffused region and said second-conductivity-type diffused region have straight portions with uniform interval, and a corner part formed at an end portion of said straight portions,
wherein at said corner part in said second-conductivity-type diffused region, the interval between said first-conductivity-type diffused region and said second-conductivity-type diffused region is larger than the interval between said straight portions, and conductivity characteristics in the larger interval region are different from conductivity characteristics of said second-conductivity-type well along a predetermined width in order to relieve concentration of electric fields at said corner part,
wherein a plurality of first-conductivity-type regions and second-conductivity-type regions are formed along a predetermined width in said interval region.

6. The semiconductor device as defined in claim 1, wherein a first-conductivity-type diffused surface layer is formed on a surface of said second-conductivity-type well.

7. The semiconductor device as defined in claim 4, wherein a first-conductivity-type diffused surface layer is formed on a surface of said second-conductivity-type well, and said first-conductivity-type surface layer has a different impurity concentration from said first-conductivity-type diffused surface layer.

8. The semiconductor device as defined in claim 1, wherein said first-conductivity-type diffused region and said second-conductivity-type diffused region are opposite to one another and form the teeth of a comb pattern, and said corner part is formed at an end portion of the teeth of the comb pattern.

9. The semiconductor device as defined in claim 1, wherein said first-conductivity-type diffused region is formed inside said second-conductivity-type well.

10. The semiconductor device as defined in claim 1, wherein said first-conductivity-type diffused region is formed outside said second-conductivity-type well.

11. The semiconductor device as defined in claim 1, wherein a second-conductivity-type source region is formed inside said first-conductivity-type region, and said second-conductivity-type diffused region formed inside said second-conductivity-type well is a MOSFET that functions as a drain region.

12. The semiconductor device as defined in claim 3, wherein a first-conductivity-type diffused surface layer is formed on a surface of said second-conductivity-type well.

13. The semiconductor device as defined in claim 3, wherein said first-conductivity-type diffused region and said second-conductivity-type diffused region are opposite to one another and form the teeth of a comb pattern, and said corner part is formed at an end portion of the teeth of the comb pattern.

14. The semiconductor device as defined in claim 3, wherein said first-conductivity-type diffused region is formed inside said second-conductivity-type well.

15. The semiconductor device as defined in claim 3, wherein said first-conductivity-type diffused region is formed outside said second-conductivity-type well.

16. The semiconductor device as defined in claim 3, wherein a second-conductivity-type source region is formed inside said first-conductivity-type region, and said second-conductivity-type diffused region formed inside said second-conductivity-type well is a MOSFET that functions as a drain region.

17. The semiconductor device as defined in claim 4, wherein a first-conductivity-type diffused surface layer is formed on a surface of said second-conductivity-type well.

18. The semiconductor device as defined in claim 4, wherein said first-conductivity-type diffused region and said second-conductivity-type diffused region are opposite to one another and form the teeth of a comb pattern, and said corner part is formed at an end portion of the teeth of the comb pattern.

19. The semiconductor device as defined in claim 4, wherein said first-conductivity-type diffused region is formed inside said second-conductivity-type well.

20. The semiconductor device as defined in claim 4, wherein said first-conductivity-type diffused region is formed outside said second-conductivity-type well.

21. The semiconductor device as defined in claim 4, wherein a second-conductivity-type source region is formed inside said first-conductivity-type region, and said second-conductivity-type diffused region formed inside said second-conductivity-type well is a MOSFET that functions as a drain region.

22. The semiconductor device as defined in claim 5, wherein a first-conductivity-type diffused surface layer is formed on a surface of said second-conductivity-type well.

23. The semiconductor device as defined in claim 5, wherein said first-conductivity-type diffused region and said second-conductivity-type diffused region are opposite to one another and form the teeth of a comb pattern, and said corner part is formed at an end portion of the teeth of the comb pattern.

24. The semiconductor device as defined in claim 5, wherein said first-conductivity-type diffused region is formed inside said second-conductivity-type well.

25. The semiconductor device as defined in claim 5, wherein said first-conductivity-type diffused region is formed outside said second-conductivity-type well.

26. The semiconductor device as defined in claim 5, wherein a second-conductivity-type source region is formed inside said first-conductivity-type region, and said second-conductivity-type diffused region formed inside said second-conductivity-type well is a MOSFET that functions as a drain region.

27. The semiconductor device as defined in claim 3, wherein a field plate is connected to a potential of the second-conductivity-type diffused region, and covers the interval region.

28. The semiconductor device as defined in claim 4, wherein a field plate is connected to a potential of the second-conductivity-type diffused region, and covers the interval region.

29. The semiconductor device as defined in claim 5, wherein a field plate is connected to a potential of the second-conductivity-type diffused region, and covers the interval region.

* * * * *